(12) United States Patent
Oliver et al.

(10) Patent No.: US 8,513,113 B2
(45) Date of Patent: Aug. 20, 2013

(54) METHODS OF FORMING SEMICONDUCTOR CONSTRUCTIONS AND ASSEMBLIES

(75) Inventors: Steven Oliver, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 12/581,586

(22) Filed: Oct. 19, 2009

(65) Prior Publication Data

US 2010/0041180 A1  Feb. 18, 2010

Related U.S. Application Data

(62) Division of application No. 11/483,002, filed on Jul. 6, 2006, now Pat. No. 7,626,269.

(51) Int. Cl.
*H01L 29/40* (2006.01)

(52) U.S. Cl.
USPC .... 438/637; 257/777; 257/738; 257/E23.174; 438/629; 438/638; 438/639

(58) Field of Classification Search
USPC ......... 257/738–777, 712, E23.174; 438/108, 438/618, 629–640
See application file for complete search history.

(56) References Cited

U.S. PATENT DOCUMENTS

| | | | |
|---|---|---|---|
| 4,906,314 A | 3/1990 | Farnworth et al. | |
| 5,801,452 A | 9/1998 | Farnworth et al. | |
| 6,008,070 A | 12/1999 | Farnworth | |
| 6,077,723 A | 6/2000 | Farnworth et al. | |
| 6,083,774 A * | 7/2000 | Shiobara et al. | 438/108 |
| 6,112,735 A | 9/2000 | Farnworth | |
| 6,284,573 B1 | 9/2001 | Farnworth | |
| 6,325,057 B1 | 12/2001 | Farnworth | |
| 6,325,058 B1 | 12/2001 | Farnworth | |
| 6,326,697 B1 | 12/2001 | Farnworth | |
| 6,345,615 B1 | 2/2002 | Farnworth | |
| 6,491,574 B1 | 12/2002 | Farnworth | |
| 6,534,341 B2 | 3/2003 | Farnworth | |
| 6,664,637 B2 | 12/2003 | Jimarez et al. | |

(Continued)

FOREIGN PATENT DOCUMENTS

WO PCT/US2007/013895  6/2007
WO PCT/US2007/013895  1/2009

OTHER PUBLICATIONS

"Hysol Encapsulant" http://www.loctite.com/int_henkel/loctite/binarydata/pdf/encapsulants_LT-4145_Final_0306051.pdf; 3 pages; printed Mar. 6, 2005.

*Primary Examiner* — Eugene Lee
*Assistant Examiner* — Fang-Xing Jiang
(74) *Attorney, Agent, or Firm* — Wells St. John P.S.

(57) ABSTRACT

The invention includes semiconductor assemblies having two or more dies. An exemplary assembly has circuitry associated with a first die front side electrically connected to circuitry associated with a second die front side. The front side of the second die is adjacent a back side of the first die, and a through wafer interconnect extends through the first die. The through wafer interconnect includes a conductive liner within a via extending through the first die. The conductive liner narrows the via, and the narrowed via is filled with insulative material. The invention also includes methods of forming semiconductor assemblies having two or more dies; and includes electronic systems containing assemblies with two or more dies.

34 Claims, 16 Drawing Sheets

(56) References Cited

U.S. PATENT DOCUMENTS

| | | | |
|---|---|---|---|
| 6,720,661 B2 | 4/2004 | Hanaoka et al. | |
| 6,787,394 B2 | 9/2004 | Farnworth | |
| 6,841,883 B1* | 1/2005 | Farnworth et al. | 257/777 |
| 6,852,627 B2 | 2/2005 | Sinha | |
| 6,984,583 B2 | 1/2006 | Farnworth | |
| 7,180,149 B2 | 2/2007 | Yamamoto et al. | |
| 8,378,462 B2* | 2/2013 | Matsumoto | 257/621 |
| 8,399,987 B2* | 3/2013 | Kwon et al. | 257/730 |
| 2003/0071354 A1* | 4/2003 | Tsai et al. | 257/738 |
| 2004/0087126 A1 | 5/2004 | Fartash | |
| 2004/0089948 A1* | 5/2004 | Cheng et al. | 257/758 |
| 2004/0155354 A1* | 8/2004 | Hanaoka et al. | 257/774 |
| 2004/0259292 A1 | 12/2004 | Beyne et al. | |
| 2005/0200027 A1 | 9/2005 | Sinha | |
| 2005/0227415 A1 | 10/2005 | Farnworth et al. | |
| 2006/0068580 A1 | 3/2006 | Dotta | |
| 2006/0087042 A1* | 4/2006 | Kameyama et al. | 257/774 |
| 2006/0223301 A1* | 10/2006 | Vanhaelemeersch et al. | 438/618 |
| 2011/0316166 A1* | 12/2011 | Yu et al. | 257/774 |

* cited by examiner

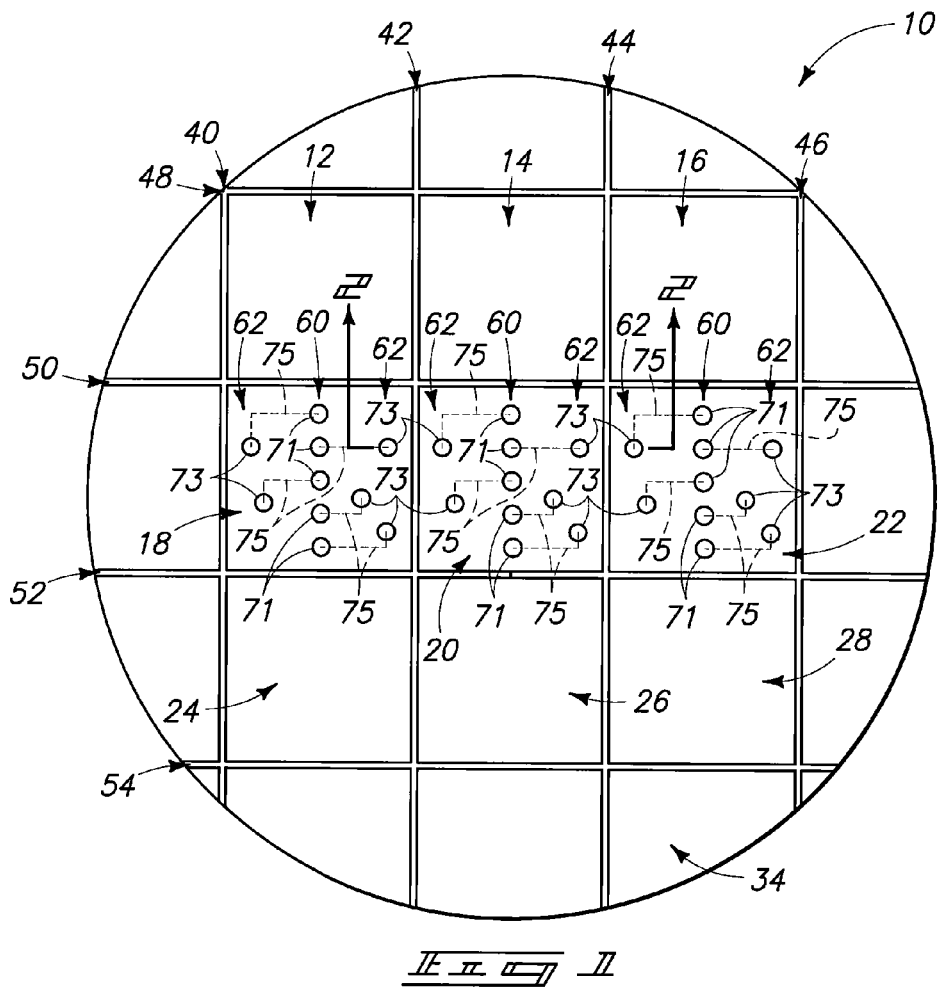
$\mathbb{F} \mathbb{I} \mathbb{G} \; \mathbb{1}$
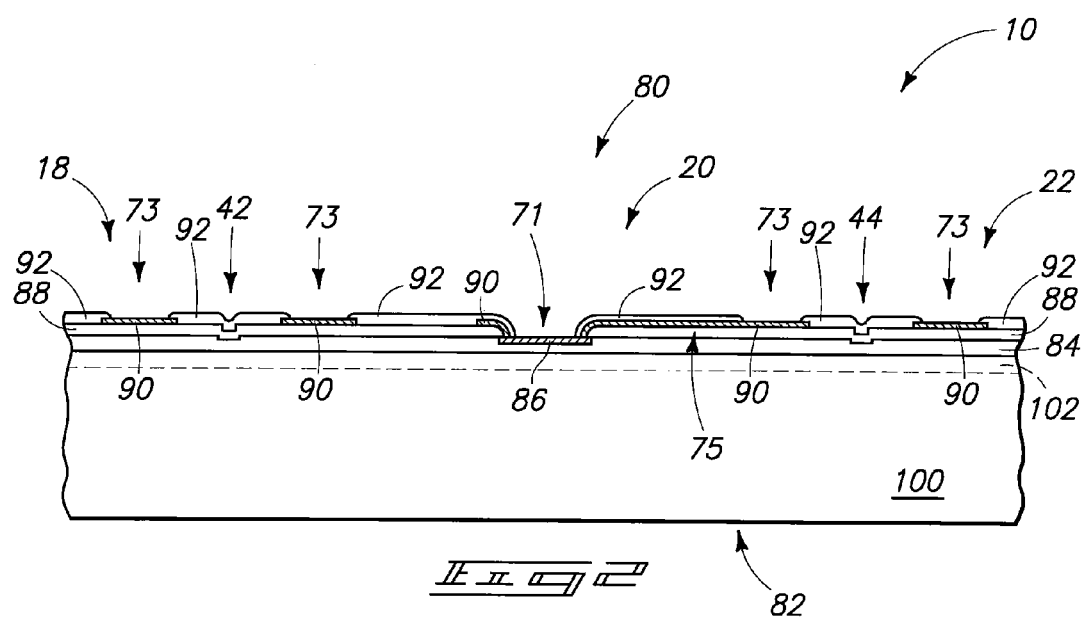
$\mathbb{F} \mathbb{I} \mathbb{G} \; \mathbb{2}$

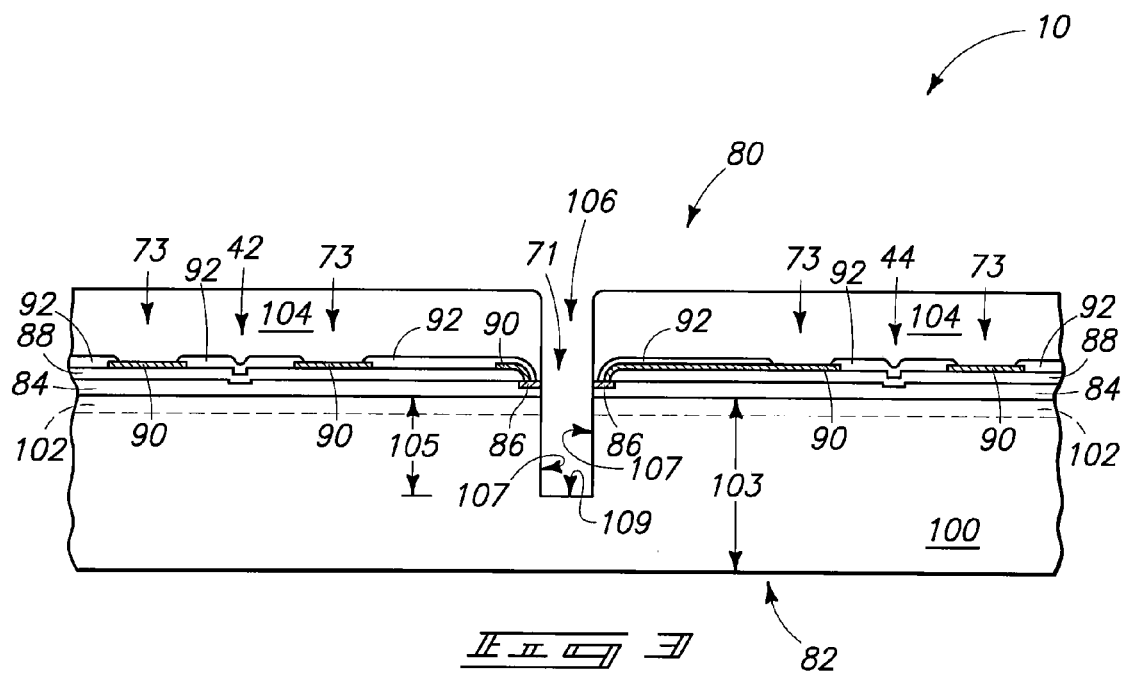
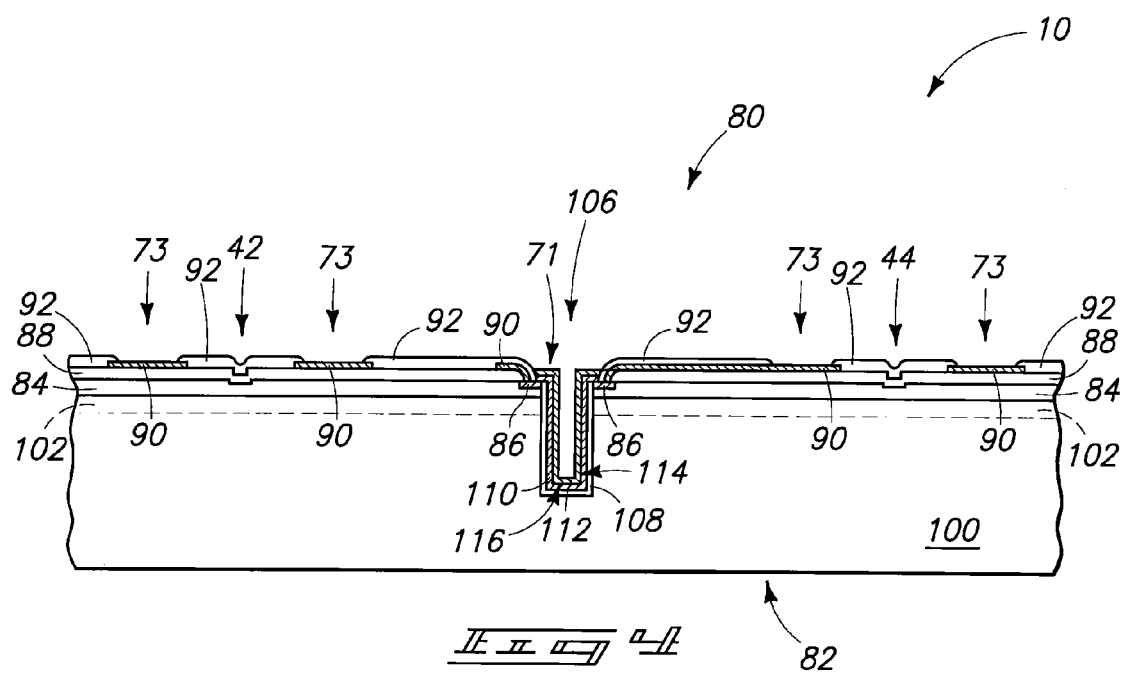

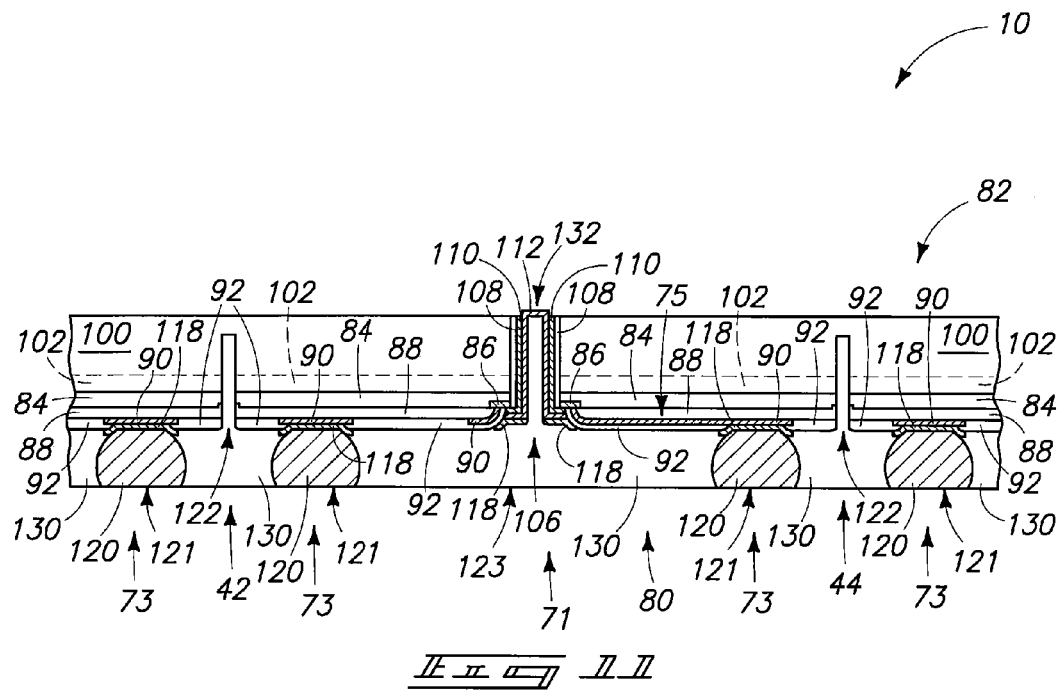
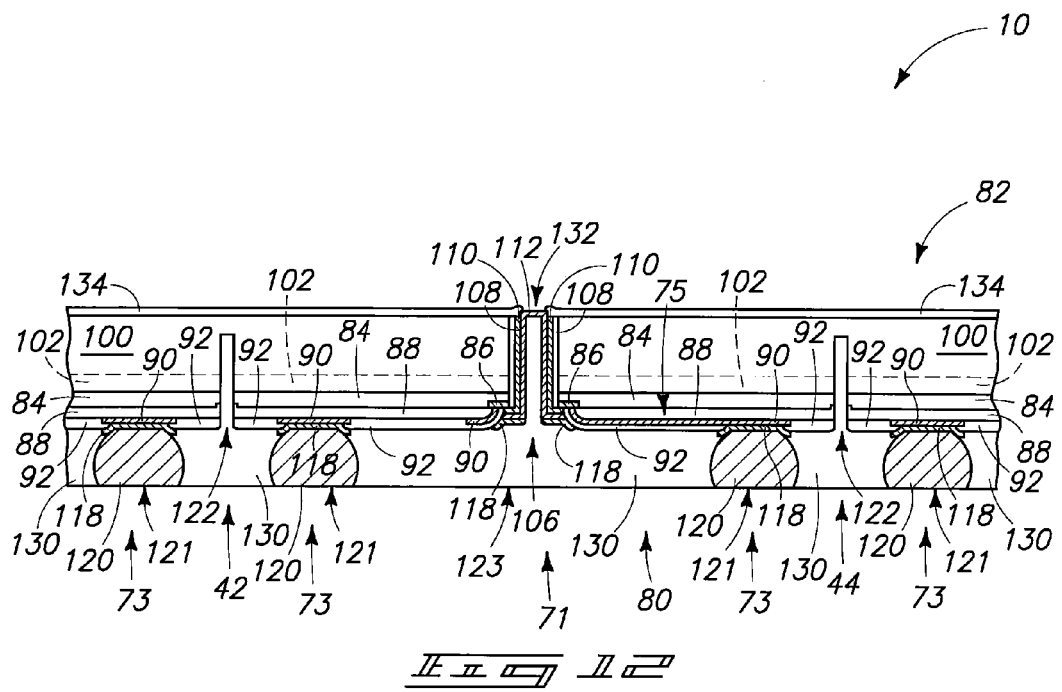

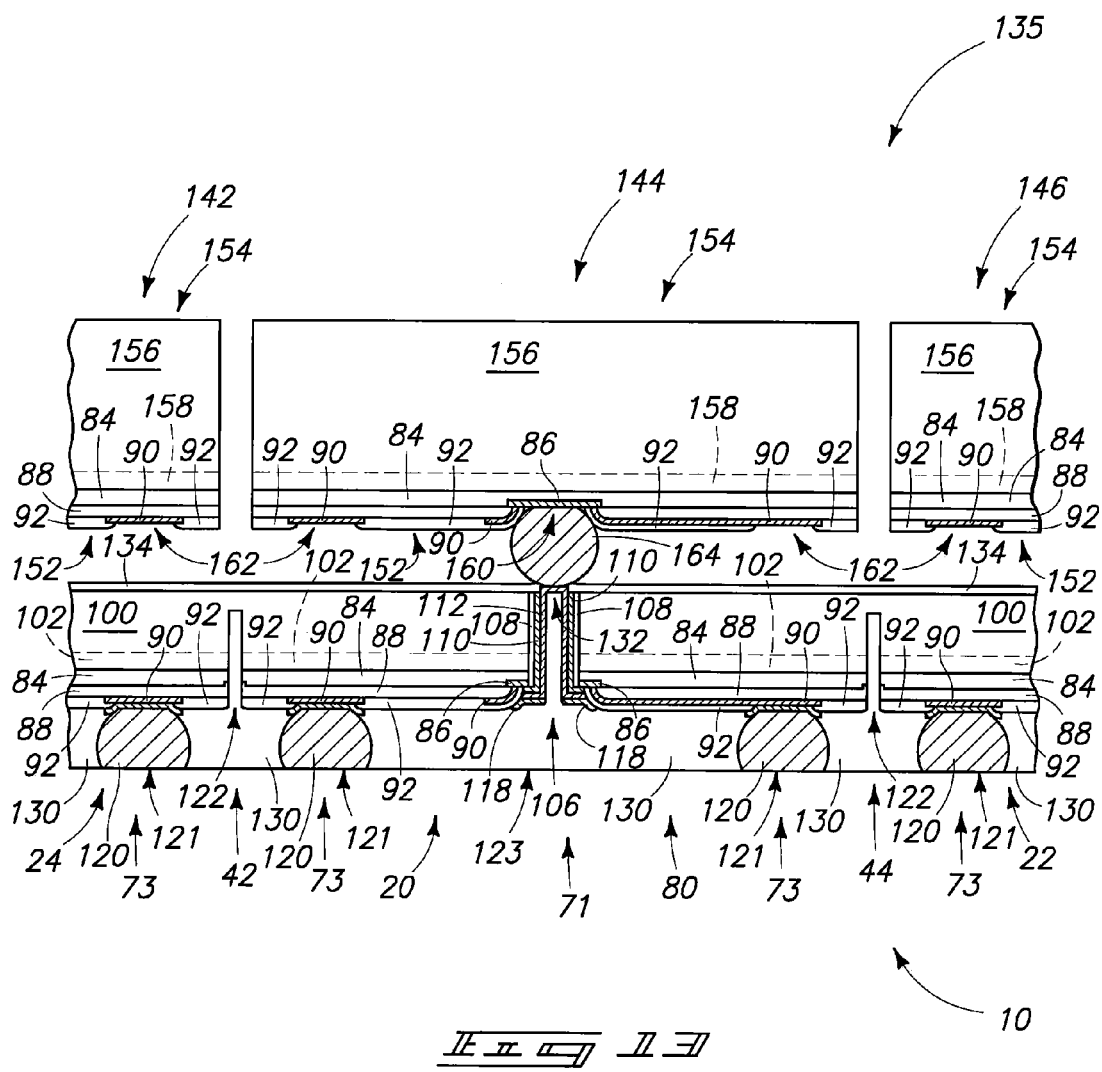

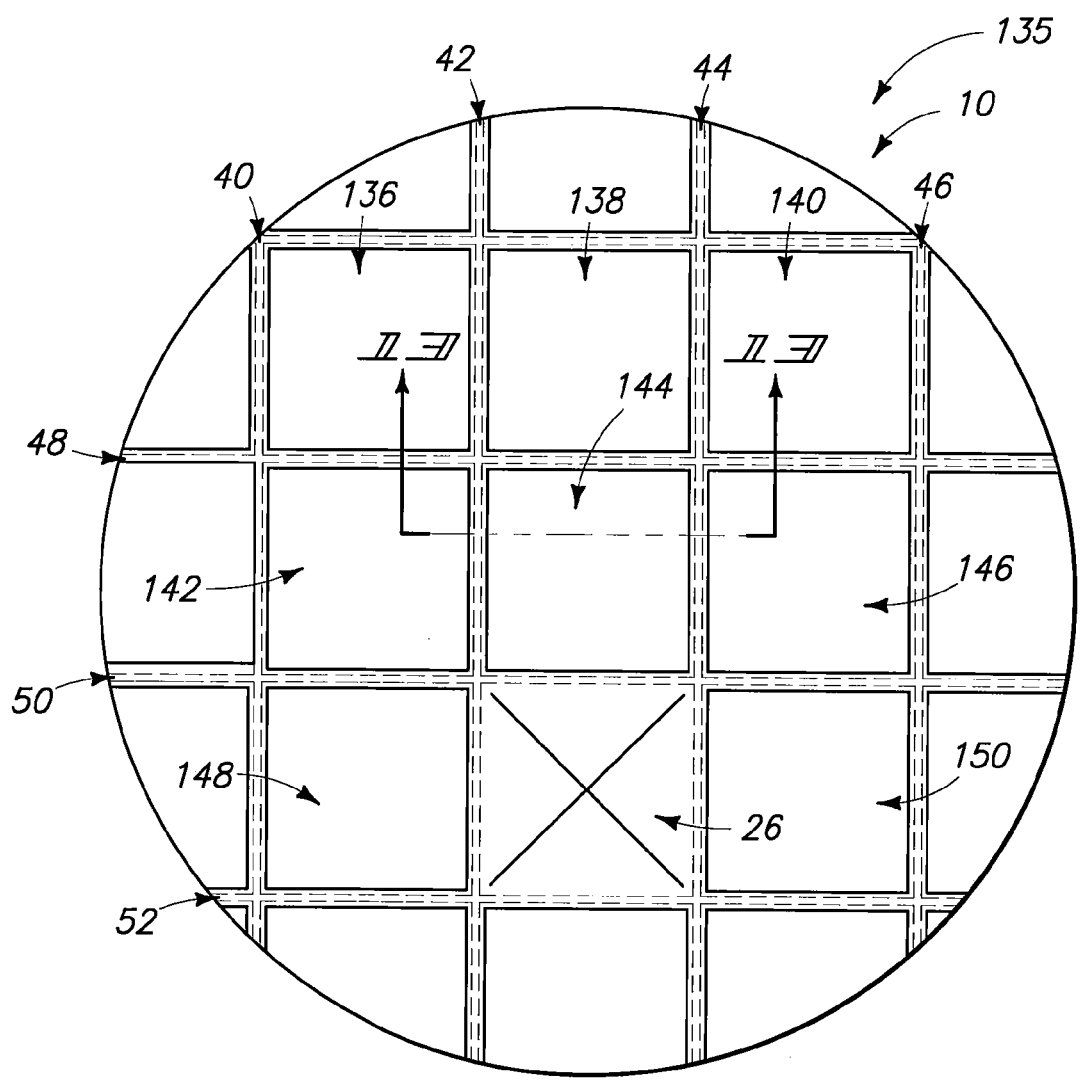

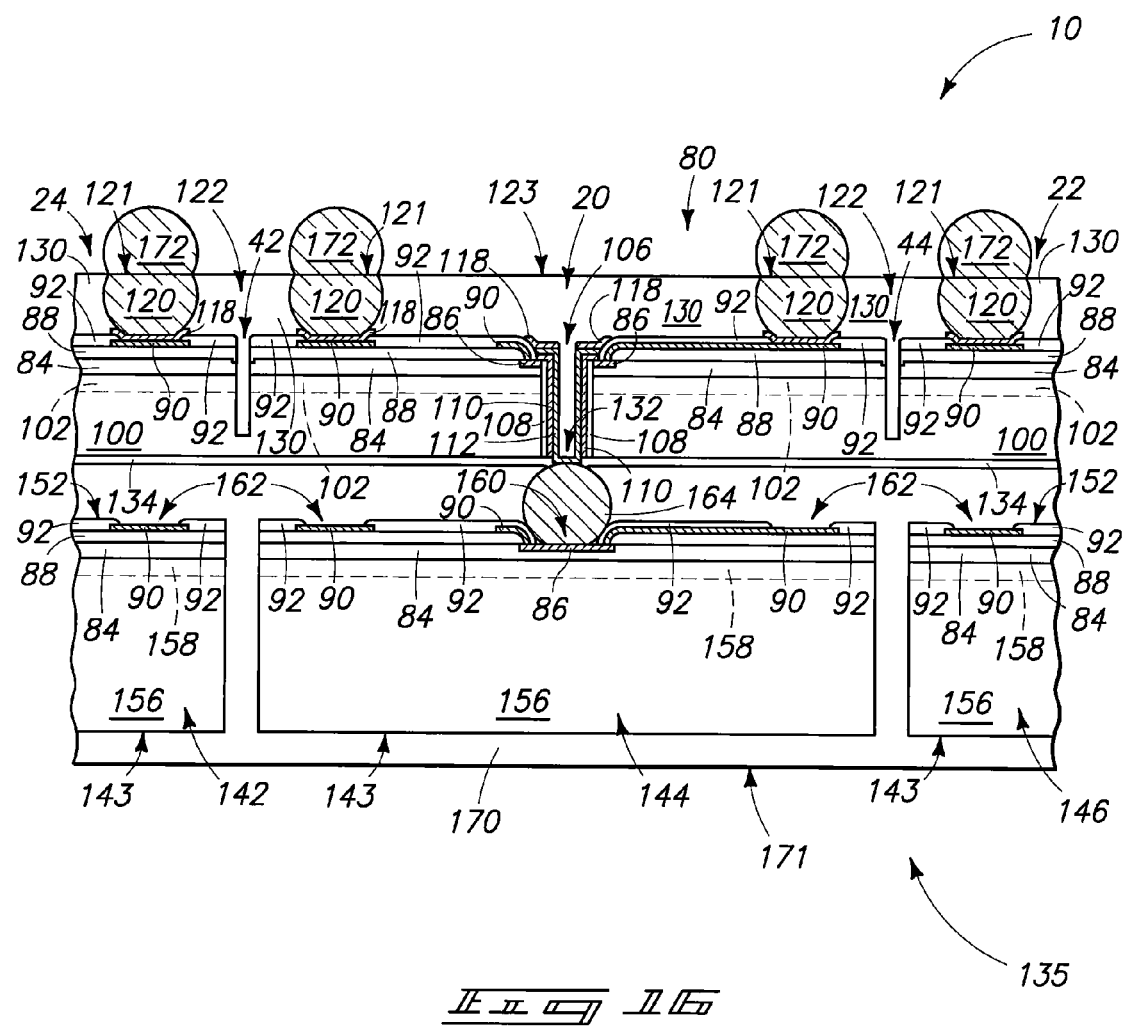

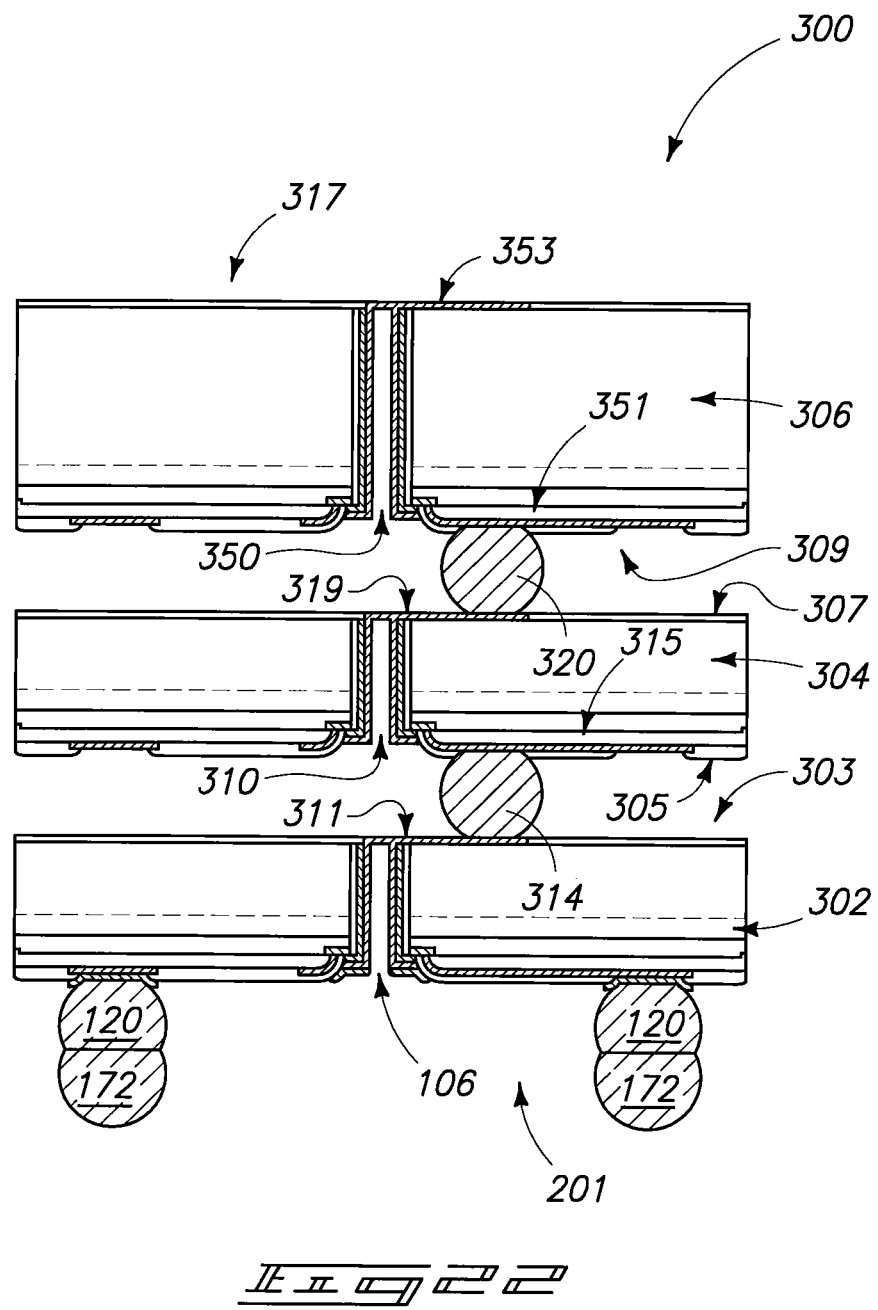

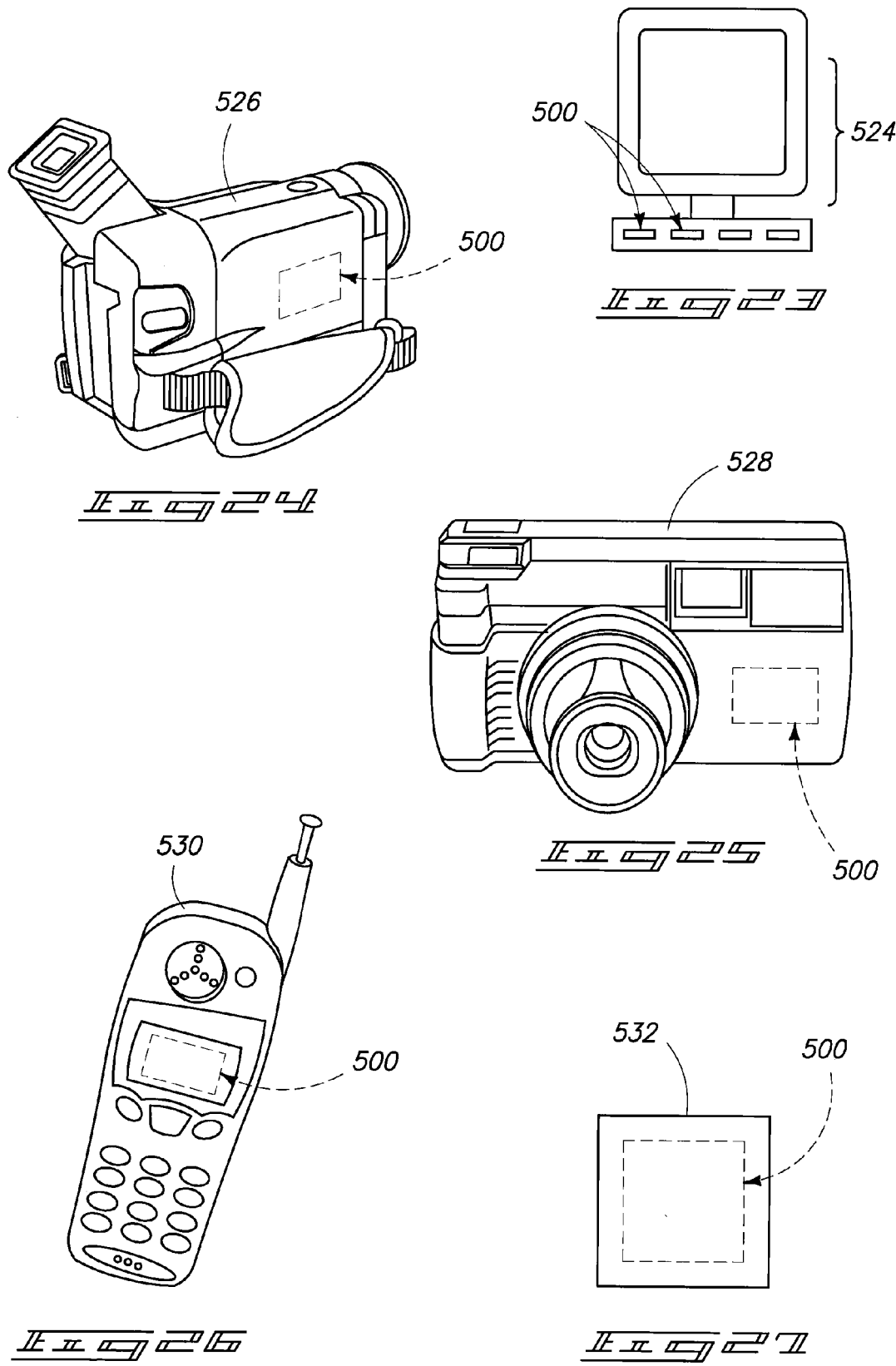

METHODS OF FORMING SEMICONDUCTOR CONSTRUCTIONS AND ASSEMBLIES

RELATED PATENT DATA

This patent resulted from a divisional of U.S. patent application Ser. No. 11/483,002, which was filed Jul. 6, 2006, and which is hereby incorporated herein by reference.

TECHNICAL FIELD

The invention pertains to semiconductor constructions and assemblies, electronic systems, and to methods of forming semiconductor constructions and assemblies.

BACKGROUND OF THE INVENTION

Semiconductor manufacturers have developed assemblies (also referred to herein as packages), which contain multiple semiconductor dies. For example, systems in a package (SIP) applications can include multiple dies having different configurations, such as a memory configuration, a processing configuration, or an application-specific configuration. The multiple dies can provide increased integration, security and performance in a single package relative to single-die packages.

One aspect of the various multi-die assemblies is that they typically have a relatively large peripheral outline and thickness. For example, conventional SIPs have two or more dies spread out on a common substrate. These assemblies typically have a much larger footprint than conventional single-die semiconductor packages. It would be desirable to develop packages containing multiple dies, and yet efficiently utilizing space. It would also be desirable for such packages to have robust electrical connection between the various dies retained therein.

BRIEF DESCRIPTION OF THE DRAWINGS

Preferred embodiments of the invention are described below with reference to the following accompanying drawings.

FIG. 1 is a top view of a semiconductor wafer construction at a preliminary processing stage of an exemplary aspect of the present invention.

FIG. 2 is a diagrammatic, cross-sectional side view of a fragment of the wafer construction of FIG. 1 along the line 2-2 of FIG. 1. The scale of FIG. 2 is different than that of FIG. 1.

FIG. 3 is a view of the fragment of FIG. 2 shown at a processing stage subsequent to that of FIG. 2.

FIG. 4 is a view of the fragment of FIG. 2 shown at a processing subsequent to that of FIG. 3.

FIG. 12 is a view of the fragment of FIG. 11 shown at a processing stage subsequent to that of FIG. 11.

FIG. 13 is a view of the fragment of FIG. 11 shown in an assembly, and at a processing stage subsequent to that of FIG. 12.

FIG. 14 is a top view of a semiconductor wafer construction containing the assembly of FIG. 13. The scale of FIG. 14 is the same as that of FIG. 1, and different than that of FIG. 13. The wafer of FIG. 14 is shown inverted relative to the wafer of FIG. 1.

FIG. 16 is a view of the assembly of FIG. 13 shown at a processing stage subsequent to that of FIG. 15. The assembly of FIG. 16 is shown inverted relative to that of FIG. 15.

FIG. 17 is a view of the assembly of FIG. 13 shown at a processing stage subsequent to that of FIG. 16. The assembly of FIG. 17 is shown inverted relative to that of FIG. 16.

FIG. 22 is a view of an assembly comprising multiple semiconductor dies, and illustrating yet another aspect of the present invention.

FIG. 23 is a diagrammatic view of a computer system incorporating components constructed in accordance with aspects of the invention.

FIG. 24 is a diagrammatic view of a camcorder system incorporating components constructed in accordance with aspects of the invention.

FIG. 25 is a diagrammatic view of a camera system incorporating components constructed in accordance with aspects of the invention.

FIG. 26 is a diagrammatic view of a cellular phone system incorporating components constructed in accordance with aspects of the invention.

FIG. 27 is a diagrammatic view of a medical device system incorporating components constructed in accordance with aspects of the invention.

DETAILED DESCRIPTION OF THE PREFERRED EMBODIMENTS

Figure 5:
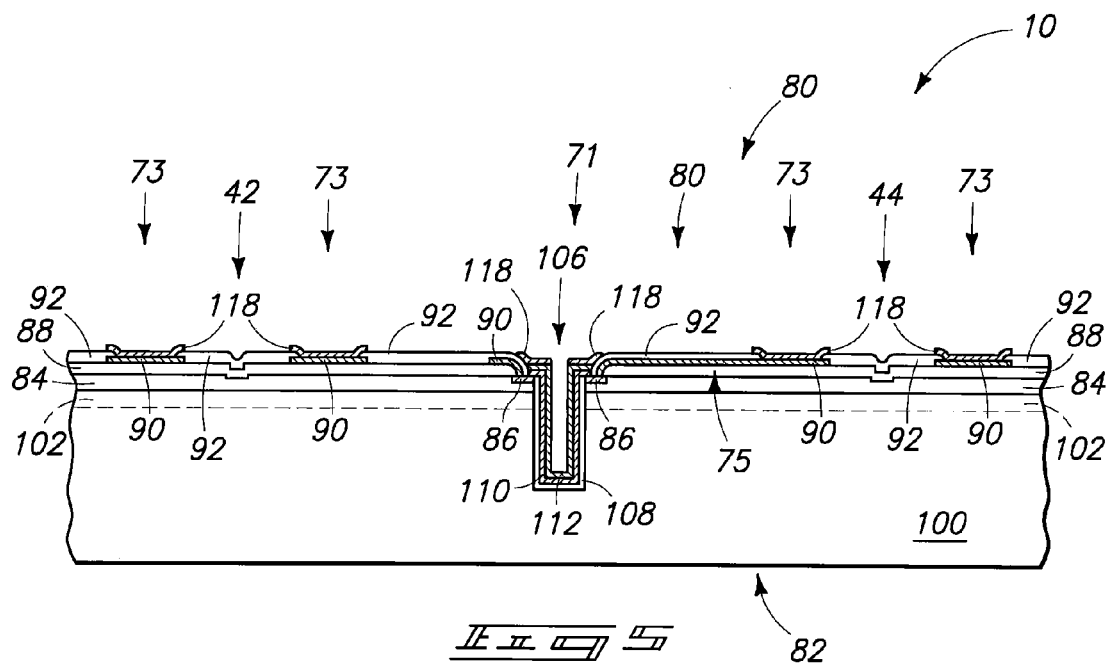
FIG. 5 is a view of the fragment of FIG. 2 shown at a processing stage subsequent to that of FIG. 4.

This disclosure of the invention is submitted in furtherance of the constitutional purposes of the U.S. Patent Laws "to promote the progress of science and useful arts" (Article 1, Section 8).

The invention includes aspects in which through wafer interconnects are formed as conductive liners within through wafer vias. In some aspects, dam and fill encapsulation methodology can be utilized to fill the lined vias. The present invention can produce efficient stacked-die assemblies containing two or more stacked dies. In particular aspects, a vacuum fill process can be utilized to assist in filling the vias with encapsulant. The conductive liners can comprise any suitable electrically conductive compositions or combination of compositions, and can, for example, comprise copper.

Exemplary aspects of the invention are described with reference to FIGS. 1-27.

Referring to FIG. 1, a semiconductor wafer construction 10 is illustrated at a preliminary processing stage. The wafer construction is subdivided into a plurality of die regions 12, 14, 16, 18, 20, 22, 24, 26 and 28; which are separated from one another, and bounded, by streets 40, 42, 44, 46, 48, 50, 52 and 54. Each of the die regions would typically be processed identically to form a plurality of identical die. The die regions can be referred to as primary die regions to distinguish them from other die regions that may be subsequently assembled to the primary die regions, and the dies formed from the primary die regions can be referred to as primary dies to distinguish them from other dies that may be subsequently assembled to the primary dies.

Each of the individual die regions has an inner region 60 (only some of which are labeled) defined as a relatively centrally located region; and an outer region 62 (only some of which are labeled) defined as a region peripheral to the inner region 60 (specifically, laterally outward of the inner region). Inner lead bond locations 71 are within the inner regions, outer lead bond locations 73 are within the outer regions, and redistribution layers 75 extend from the inner lead bond locations to the outer lead bond locations. The redistribution layers are shown in phantom view to indicate that the redistribution layers would be beneath other materials at the processing stage of FIG. 1.

The inner lead bonds extend to circuitry associated with the semiconductor die, and are frequently so tightly packed that it is difficult to electrical connect the inner lead bonds to circuitry external of the semiconductor die. The redistribution layers enable the inner lead bonds to be electrically coupled to the less tightly packed outer lead bonds, which can be more readily electrically connected to external circuitry. Although the "inner lead bond" locations are shown to be peripherally inward of the "outer lead bond" locations in the aspect of FIG. 1, it is to be understood that there are also aspects in which at least some bonds analogous to the "inner lead bonds" are actually outboard of (in other words, peripherally outward of) at least some bonds analogous to the "outer lead bonds".

Referring next to FIG. 2, a cross-section is shown through primary die region 20, and through portions of adjacent primary die regions 18 and 22; with FIG. 2 being shown at an expanded scale relative to FIG. 1. The wafer construction 10 of FIG. 2 has a front side 80 and an opposing back side 82. The front side and back side both extend across the primary die regions.

The wafer construction comprises a base semiconductor material 100. Such base semiconductor material can comprise, consist essentially of, or consist of silicon, and in some aspects can comprise, consist essentially of, or consist of monocrystalline silicon. Typically, the base semiconductor material will correspond to a semiconductor wafer, such as, for example, a monocrystalline silicon wafer.

The base semiconductor material of wafer construction 10 can be referred to as a first base material to distinguish the material from semiconductor material of other dies (discussed below) incorporated into assemblies with primary dies of wafer 10. In some aspects, the base semiconductor material can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A region 102 is shown at the front side of the base semiconductor material. The region 102 can comprise integrated circuitry (not shown), and such circuitry can be considered to be associated with the front side of a semiconductor wafer corresponding to base material 100. As is known to persons of ordinary skill in the art, the integrated circuitry can be present as multiple patterned layers of conductive materials, insulative materials and/or semiconductor materials, and can, for example, comprise various memory devices and/or logic devices.

A passivation layer 84 is over circuitry of region 102. The passivation layer can comprise any suitable materials, including, for example, one or more of parylene, polyimide, photoresist, and silicon dioxide. The streets 42 and 44 can be seen to correspond to indentations patterned into layer 84.

A pad of electrically conductive material 86 extends into the passivation layer, and would typically be connected with at least some of the circuitry of region 102 with appropriate electrical interconnects (not shown). Material 86 can comprise any suitable electrically conductive composition or combination of compositions, and in some aspects can comprise, consist essentially of, or consist of aluminum or copper. The material 86 corresponds to an inner lead bond pad at the location 71.

A patterned electrically insulative material 88 is over passivation layer 84, and has an opening extending therethrough to an upper surface of material 86. The insulative material 88 can comprise any suitable electrically insulative composition or combination of compositions, and will typically comprise, consist essentially of, or consist of polyimide.

Electrically conductive material 90 is patterned over material 88 to form outer lead bond pads at locations 73, and to form redistribution layers 75. Material 90 can comprise any suitable composition or combination of compositions, and in some aspects can comprise, consist essentially of, or consist of aluminum or copper.

A patterned electrically insulative material 92 is over insulative material 88, and over some of the patterned conductive material 90. Insulative material 92 has openings extending therethrough to the outer lead bond pads and the inner lead bond pads. The insulative material 92 can comprise any suitable composition or combination of compositions, and in some aspects can comprise, consist essentially of, or consist of polyimide.

Insulative materials 88 and 92 extend into the indentations of layer 84 so that the pattern of streets 42 and 44 is transferred to a surface topography of material 92.

Referring to FIG. 3, a patterned mask 104 is formed across construction 10. The mask is initially provided with an opening 106 extending therethrough to the inner lead bond pad at location 71. The patterned mask can correspond to, for example, photolithographically patterned photoresist.

After the provision of the patterned mask, construction 10 is subjected to suitable etching to extend the opening through conductive material 86 of the inner lead bond pad, through passivation layer 84, and into base semiconductor material (or semiconductor wafer) 100. Thus, the opening is extended through the front side of a die region and into the base semiconductor material of the die contained within the die region. The opening within base semiconductor material 100 can be considered a via 106. The processing of FIG. 3 would typically be conducted relative to all of the die regions of the FIG.

1 wafer construction, and would typically be conducted to form vias extending through each of the inner lead bond pads associated with each of the die regions. The etching through the inner lead bond pad and passivation layer can comprise any suitable etch or combination of etches. In some aspects, the inner lead bond pad can comprise a stack of different materials, and the etch can comprise several different etches for penetrating the various materials of the stack and the passivation layer.

The via 106 can be formed to any suitable depth within base material 100. In typical aspects, base material 100 and region 102 will have a combined thickness 103 of about 725 microns, and via 106 will extend into material 100 and region 102 to a depth 105 of about 150 microns.

The via 106 has a sidewall periphery 107 (also referred to as a sidewall) and a bottom periphery 109 (also referred to as a bottom), both of which extend along base material 100.

Referring to FIG. 4, mask 104 (FIG. 3) is removed. An electrically insulative material 108 is formed within via 106, a barrier material 110 is formed over insulative material 108, and an electrically conductive liner 112 is formed over barrier material 110.

Insulative material 108 can comprise any suitable composition or combination of compositions, and can, for example, comprise, consist essentially of, or consist of one or more of parylene, spin-on-dielectric and silicon dioxide. The material 108 can be formed into the shown configuration by initially providing the material across the substrate and within the via, and then utilizing a spacer etch to pattern the material. The insulative material 108 would typically formed by chemical vapor deposition (CVD), physical vapor deposition (PVD) and/or atomic layer deposition (ALD).

Conductive liner 112 can comprise any suitable composition or combination of compositions, and in particular aspects can comprise, consist essentially of, or consist of copper and nickel.

Barrier material 110 is a barrier to copper diffusion, and can comprise any suitable composition or combination of compositions; and in particular aspects can comprise, consist essentially of, or consist of one or more of titanium, tantalum and tantalum nitride. If conductive liner 112 comprises a material other than copper, the copper barrier 110 can be omitted. Further, it may be possible in some aspects to omit insulative material 108.

Liner 112 and barrier material 110 can be formed into the shown configuration with any suitable processing. In some aspects, the composition (or compositions) of the barrier material can be sputter-deposited within the via and across the wafer; copper seed material can be deposited across the barrier material within the via and across the wafer; a plating mask (not shown) can be formed over the wafer to leave the vias exposed; copper and nickel can be plated over the seed material within the exposed vias to form liner 112 to comprise the seed material together with the plated copper and nickel; the plating mask can be removed; and the seed material and barrier material external of the via can be removed with suitable processing.

Layers 108, 110 and 112 can be formed to various thicknesses. In some aspects, conductive layer 112 will have a thickness of greater than or equal to about 3 microns, while layers 108 and 110 will together have a combined thickness of less than 3 microns. It is to be understood, however, that any suitable thicknesses of the layers can be utilized, and that the particular thicknesses preferred for particular applications can depend on, for example, the geometry of the via and the electrical properties of the layers.

In the shown aspect of the invention, layer 108 does not extend to over conductive pad material 86, but layers 110 and 112 do extend to over the conductive pad material 86.

The layers 108, 110 and 112 can be considered to narrow via 106. The via 106 will typically be circular or elliptical when viewed from above (in other words, will have a shape similar to the shape of the inner lead bond pad location 71 into which it extends, with the inner lead bond pad locations 71 being shown to have substantially circular or elliptical shapes when viewed from above in the top view of FIG. 1). Thus, the layers 108, 110 and 112 can be considered to form containers within the via 106. The layer 112, for example, comprises a tubular segment 114 along the sidewall periphery of the via, and comprises a cap 116 along the bottom periphery of the via; with the tubular segment and cap together defining a container shape.

Referring next to FIG. 5, under bump material 118 is formed over conductive material 90 of the outer lead bond pads at locations 73, and over the conductive material 112 across the inner lead bond pad at location 71. The under bump material can comprise any suitable composition or combination of compositions, and typically will comprise gold and/or palladium over nickel. The under bump material can be formed by, for example, electroless plating. In some aspects, sacrificial material (not shown) can be provided within via 106 during formation of under bump material 118 to preclude the under bump material from forming within the via. Such sacrificial material can be subsequently removed to leave the construction of FIG. 5.

Figure 6:
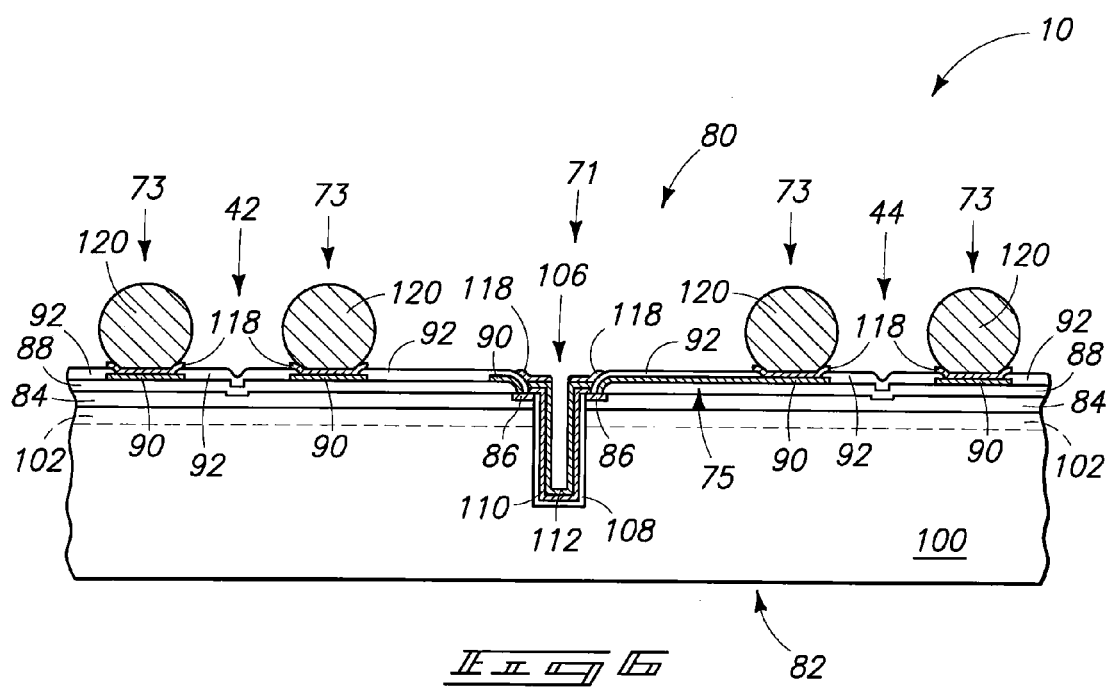
FIG. 6 is a view of the fragment of FIG. 2 shown at a processing stage subsequent to that of FIG. 5.

Referring next to FIG. 6, solder balls 120 are bonded to the under bump materials 118 associated with the outer lead bond pads at locations 73. The solder balls 120 will typically be substantially spherical; and can have any suitable diameters, including, for example, diameters of at least about 200 microns, at least about 333 microns, or at least about 400 microns. A solder ball is not bonded to inner lead bond pad location 71 at the processing stage of FIG. 6.

Figure 7:
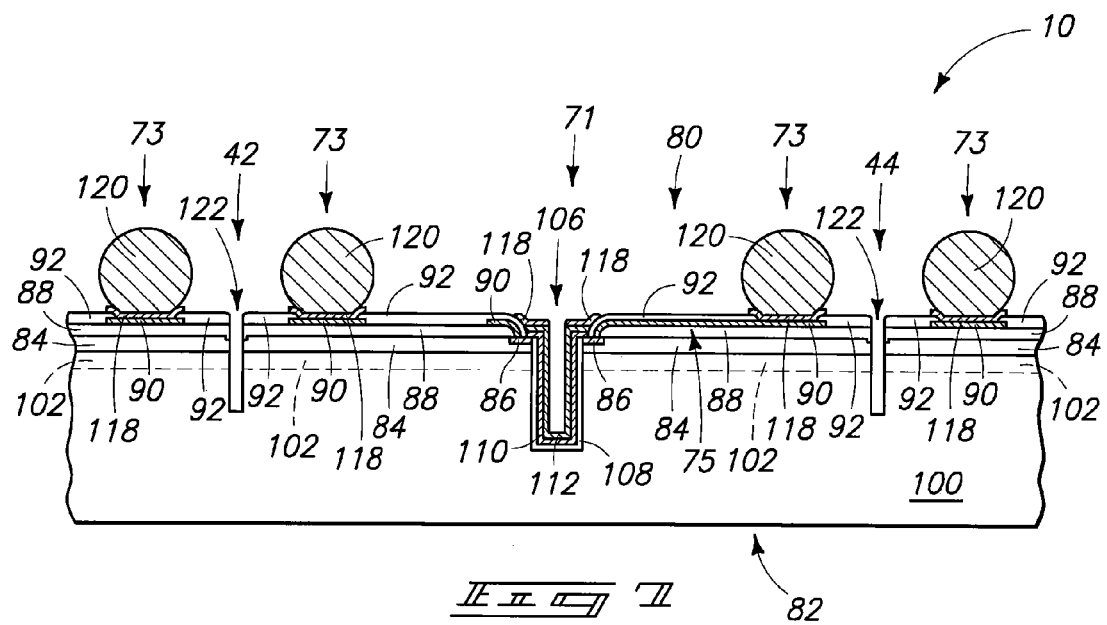
FIG. 7 is a view of the fragment of FIG. 2 shown at a processing stage subsequent to that of FIG. 6.

Referring next to FIG. 7, trenches 122 are cut into the locations of the streets 42 and 44. Such cutting would occur at locations of all of the streets 40, 42, 44, 46, 48, 50, 52 and 54 shown in FIG. 1. The trenches 122 can be formed to be deeper than via 106 (as discussed below with reference to FIGS. 18-20), which can include, in some aspects, forming the trenches to extend entirely through base 100; or can be formed to be less deep than via 106 as shown in FIG. 7. The trenches can be formed by mounting wafer construction 10 to a film frame and then subjecting the construction to a dice scribe.

Figure 8:
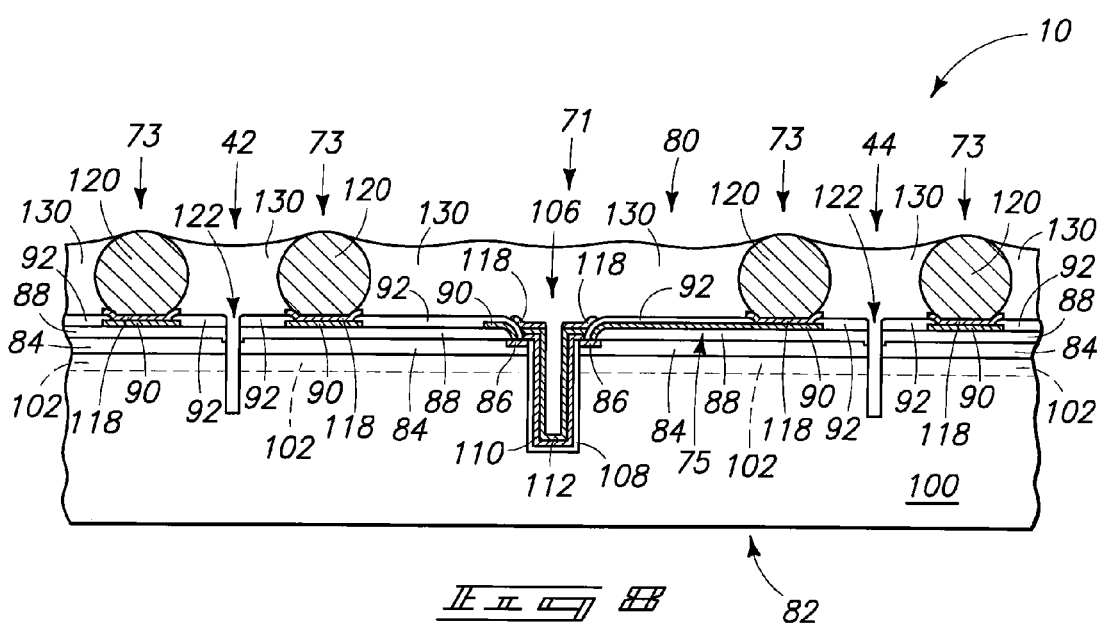
FIG. 8 is a view of the fragment of FIG. 2 shown at a processing stage subsequent to that of FIG. 7.

Referring next to FIG. 8, low-conductivity (in other words, electrically insulative) material 130 is formed across the front surface of wafer construction 10 and between solder balls 120. The material 130 extends into trenches 122 and via 106, and preferably uniformly fills the trenches and via. The via 106 is narrowed by conductive liner 112 at the processing stage of FIG. 8, and accordingly material 130 can be considered to fill the narrowed via.

Figure 9:
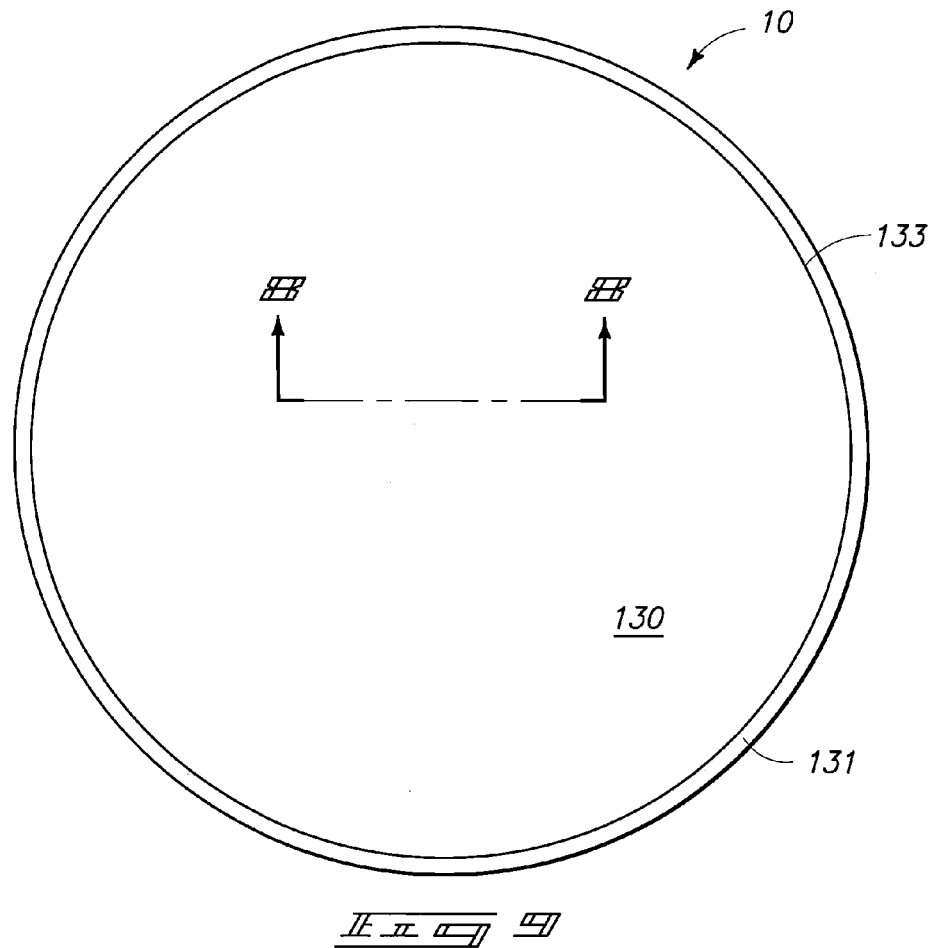
FIG. 9 is a top view of a semiconductor wafer construction comprising the fragment of FIG. 8 along the line 8-8. The scale of FIG. 9 is the same as that of FIG. 1, and different than that of FIG. 8.

Material 130 can comprise any suitable material. In particular aspects, material 130 is a thermally-curable low-viscosity polymeric material deposited by a dam and fill process (and can, for example, utilize materials traditionally utilized for so-called "glob top" encapsulation). FIG. 9 shows a top view of a wafer construction 10 at the processing stage of FIG. 8. Such shows a dam 131 formed around a dammed region 133 around a periphery of the wafer construction, and shows low viscosity material 130 filling a region 133 bounded by the dam. Dam 131 can comprise a relatively high-viscosity encapsulant material, such as, for example, a high-viscosity Hysol™ damming encapsulant of the type available from Loctite™, such as, FP4451™, FP4451TD™, or FP6401™. Low-viscosity material 130 can comprise a thermally-curable material, and in particular aspects can comprise a Hysol™ encapsulant of the type available from Loctite™, such as, CB0260™, CB064™, FP4450™, FP4450HF™, FP4450LV™, FP4460™, FP4470™, or FP4652™. The fill material 130 preferably has a coefficient of thermal expansion similar to that of silicon.

Fill material 30 can be a material flowed across construction 10 under first conditions in which the material has a low viscosity, and which is then subjected to second conditions which cure the material. In some aspects, fill material 130 can be a thermally-curable material that is flowed across construction 10 at a first temperature at which the material has suitable low viscosity, and then cured at a second temperature to transform the material to a substantially solid mass. The term "substantially solid" is used to indicate that the cured material may be a traditional solid, or a semi-solid, such as a gel or glass. In some aspects, the material is flowed at a first temperature, and then cured at an elevated temperature (in some aspects, the first temperature can be from about 70° C. to about 80° C., and the elevated temperature can be about 120° C.). In other aspects, the material can be flowed at a first temperature, and cured at a second temperature which is reduced relative to the first temperature, or which is about the same as the first temperature. If the curing temperature is different than the temperature at which material 30 is initially flowed across construction 10, the curing can be considered to be thermal curing of the material.

As discussed above with reference to FIG. 1, there would be numerous identical primary die regions across the wafer construction, having numerous inner lead bond pad locations. The processing of FIGS. 3-7 would typically be conducted identically across the various primary die regions so that numerous vias and street trenches are simultaneously filled with material 130 at the processing stage of FIGS. 8 and 9. In some aspects, the flow of the relatively low-viscosity material 130 into the vias and street trenches can be assisted by subjecting the low-viscosity material to one or more sequences of pressure changes. For instance, the low-viscosity material can be subjected to a vacuum (in other words, a pressure less than atmospheric pressure, and in some cases much less than atmospheric pressure) to pull gases from the vias and street trenches through the low-viscosity material and thereby evacuate the gases from within the vias and street trenches; and subsequently pressure in excess of atmospheric pressure can be applied to push the low-viscosity material into the evacuated vias and street trenches. The process utilizing vacuum followed by overpressure can be referred to as a "vacuum bulp" process. The sequence of vacuum and overpressure can be repeated multiple times in some aspects of the invention.

The formation of insulative material 130 across the front side of the wafer can advantageously provide a handle which can be utilized for retaining construction 10 during subsequent manipulations of the construction (in other words, can act as a carrier for the wafer).

Figure 10:
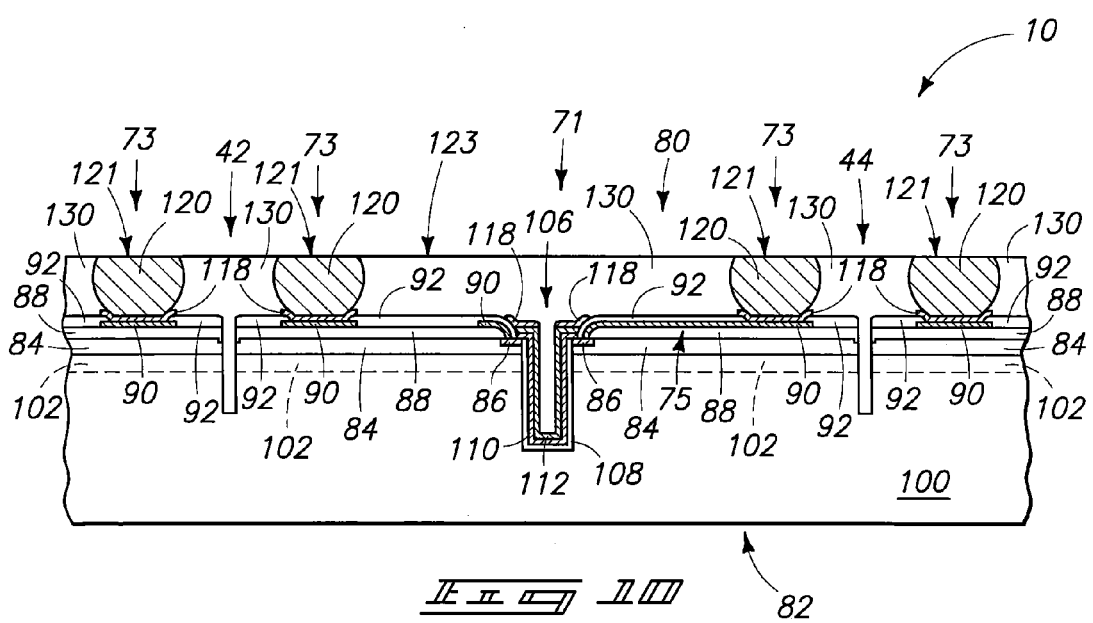
FIG. 10 is a view of the fragment of FIG. 2 shown at a processing stage subsequent to that of FIG. 8.

Referring next to FIG. 10, construction 10 is subjected to appropriate processing to form a substantially planarized surface 123 extending across solder balls 120 and insulative material 130. The surface is referred to as being "substantially" planarized to indicate that the surface is planarized to within limitations of the processing and measurement methodologies utilized, which can include, but is not limited to, surfaces which are fully planar. The formation of the substantially planarized surface 123 can be accomplished with any suitable method, and can, for example, be accomplished by grinding with appropriate grit (in some aspects the grit can comprise diamond).

The substantially planarized surface 123 includes planarized surfaces of the solder balls 120. The planarized surfaces of the solder balls can be considered to be conductive nodes 121, at least some of which are electrically coupled with the outer lead bond pads. After the planarization, material 130 extends between conductive nodes 121, but not over the conductive nodes.

Figure 11:
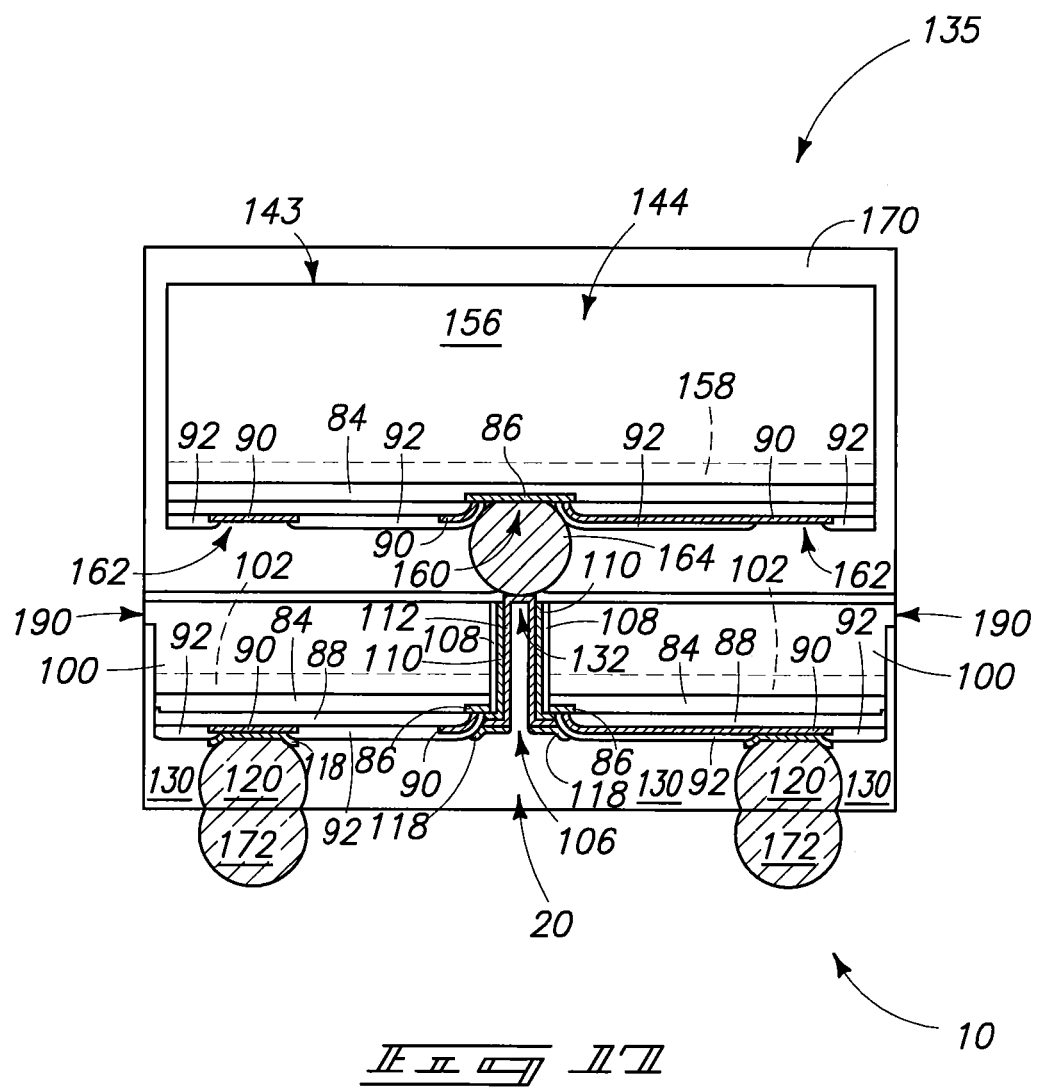
FIG. 11 is a view of the fragment of FIG. 2 shown at a processing stage subsequent to that of FIG. 10. The fragment of FIG. 11 is shown inverted relative to FIG. 10.

FIG. 11 shows construction 10 at a processing stage subsequent to that of FIG. 10, and shows the construction inverted relative to the view of FIG. 10. The construction of FIG. 11 has been thinned relative to that of FIG. 10. Specifically, base semiconductor material 100 has been removed from the back side 82 of the construction to expose a segment 132 of the conductive liner 112 within the via 106.

The removal of material 100 from the back side will typically be conducted in at least two steps. Initially, a first rapid and coarse removal can be accomplished by subjecting the back side of the die to grinding. The grinding will be ceased before segment 132 is exposed to avoid inadvertent removal of segment 132 by the grinding. Typically, the grinding will be conducted until the segment 132 is recessed beneath a surface of the back side by less than about five microns. Subsequently, additional silicon material 100 is removed from the back side with an etch selective for material 100 relative to conductive material of segment 132 (typically, conductive material 112). Such etch can be a plasma etch, and can utilize, for example, $SF_6$. The etch is shown to penetrate through insulative material 108 and barrier material 110. It is to be understood, however, that the etch is utilized to expose a conductive segment electrically connected to the conductive liner extending through the via, and accordingly the etch may or may not penetrate the barrier material in aspects in which the barrier is electrically conductive.

The etch is referred to as being selective for material 100 relative to conductive materials of segment 132. Such is to be understood as indicating that the etch removes material 100 at a faster rate than the etch removes conductive material of segment 132, which can include, but is not limited to, etches which are 100% selective for material 100 relative to the exposed conductive material of segment 132.

The thinning of construction 10 can remove the back side material that had been over via 106, and thus the via can extend entirely through base material 100 at the processing stage of FIG. 11 (as shown).

Since the trenches 122 extending into streets 42 and 44 are less deep than the via 106 in the shown aspect the invention, the thinning of the construction does not lead to exposure of the insulative material 130 within such trenches.

In the shown aspect of the invention, the grinding to form planarized surface 123 occurs before the thinning of material 100 to expose conductive segment 132. It is to be understood that the processing could be reversed in other aspects of the invention so that the thinning of material 100 occurs before the formation of planarized surface 123.

Referring next to FIG. 12, a passivation layer 134 is formed across the exposed back side surface of material 100. Passivation layer 134 can comprise any suitable composition or combination of compositions, and in particular aspects can comprise, consist essentially of, or consist of one or more of parylene, polyimide, photoresist and silicon dioxide. The passivation layer 134 is patterned to leave segment 132 exposed within an opening extending through the passivation layer. Such patterning can be accomplished by, for example, photolithography, etching and/or polishing. In some aspects, stacking arrangements can be utilized in which passivation layer 134 is omitted.

The liner 112 at the processing stage of FIG. 12 can be considered to comprise a tubular segment along a sidewall periphery of the via 106, and to comprise a cap (corresponding to exposed segment 132) which extends across the tubular segment and which is exposed along the back side of the primary die region. In some aspects, the cap can be coplanar, or approximately coplanar, with the back side surface of the primary die region.

Referring next to FIGS. 13 and 14, a plurality of secondary dies 136, 138, 140, 142, 144, 146, 148 and 150 are provided over the back sides of the primary die regions. Such forms an assembly 135 comprising the secondary dies and construction 10.

In some aspects, the primary die regions can be tested prior to provision of the secondary dies to ascertain which of the primary die regions are "good", and which are defective. The primary die regions which are good can be considered to be "known good die" (KGD) regions. The secondary dies can be provided to be only paired with KGD regions so that secondary dies are not wasted by being paired with defective primary die regions. Thus, FIG. 14 shows primary die region 26 having no secondary die paired therewith, but instead being marked with an "X" to indicate that testing of the die region has identified a defect in the die region.

The secondary dies have front sides 152, and back sides 154 in opposing relation to the front sides. The secondary dies have secondary base semiconductor material 156 which can comprise the same composition as the primary base semiconductor material 100; and accordingly can comprise, consist essentially of, or consist of silicon (and in specific aspects can be monocrystalline silicon). The secondary dies have front side regions 158 containing integrated circuitry. Also, the secondary dies have inner lead bond pads 160 and outer lead bond pads 162 analogous to the inner lead bond pads at locations 71 and outer lead bond pads at locations 73 discussed above for the primary dies. Finally, the secondary dies are shown to comprise insulative materials and conductive materials across the front sides analogous to the various materials discussed above with reference to FIG. 2 for the primary dies.

An electrical interconnect 164 is formed to extend from the inner lead bond pad 160 of the secondary die 144 to the conductive segment 132 of the primary die region 20. Similar interconnects will be formed between the other secondary dies and the known good primary dies with which the secondary dies are paired. The shown interconnect 164 is a solder ball. Although solder ball 164 is shown to be about the same size as the solder balls 120 that had been connected to the front side of the primary die regions, the solder ball 164 can alternatively be smaller than the solder balls 120—and such can be more typical than having the solder ball 164 being about the same size as the solder balls 120. The solder ball 164 will typically be substantially spherical and will have a diameter of less than or equal to about 100 microns. For instance, the solder ball 164 can have a diameter of about 80 microns; but it is to be understood that specific preferred diameters of the solder balls can depend on, among other things, the pitch of the inner lead bonds. The solder ball 164 can be referred to as a second solder ball to distinguish it from the first solder balls 120 previously discussed.

In some aspects, the front sides of the primary die regions can be considered first front sides, and the front sides of the secondary dies can be considered second front sides. Circuitry within the regions 158 associated with the second front sides is electrically connected with circuitry within the region 102 associated with the first front sides through solder ball 164 and the electrically conductive liner 112 within via 106.

In aspects in which electrical interconnects 164 comprise solder balls, the solder balls can be initially bonded to either the primary die or the secondary die, and then subsequently bonded to the other of the primary die and the secondary die.

Although not shown, it is to be understood that the secondary die can have under bump conductive material similar to the material 118 associated with the primary die.

Figure 15:
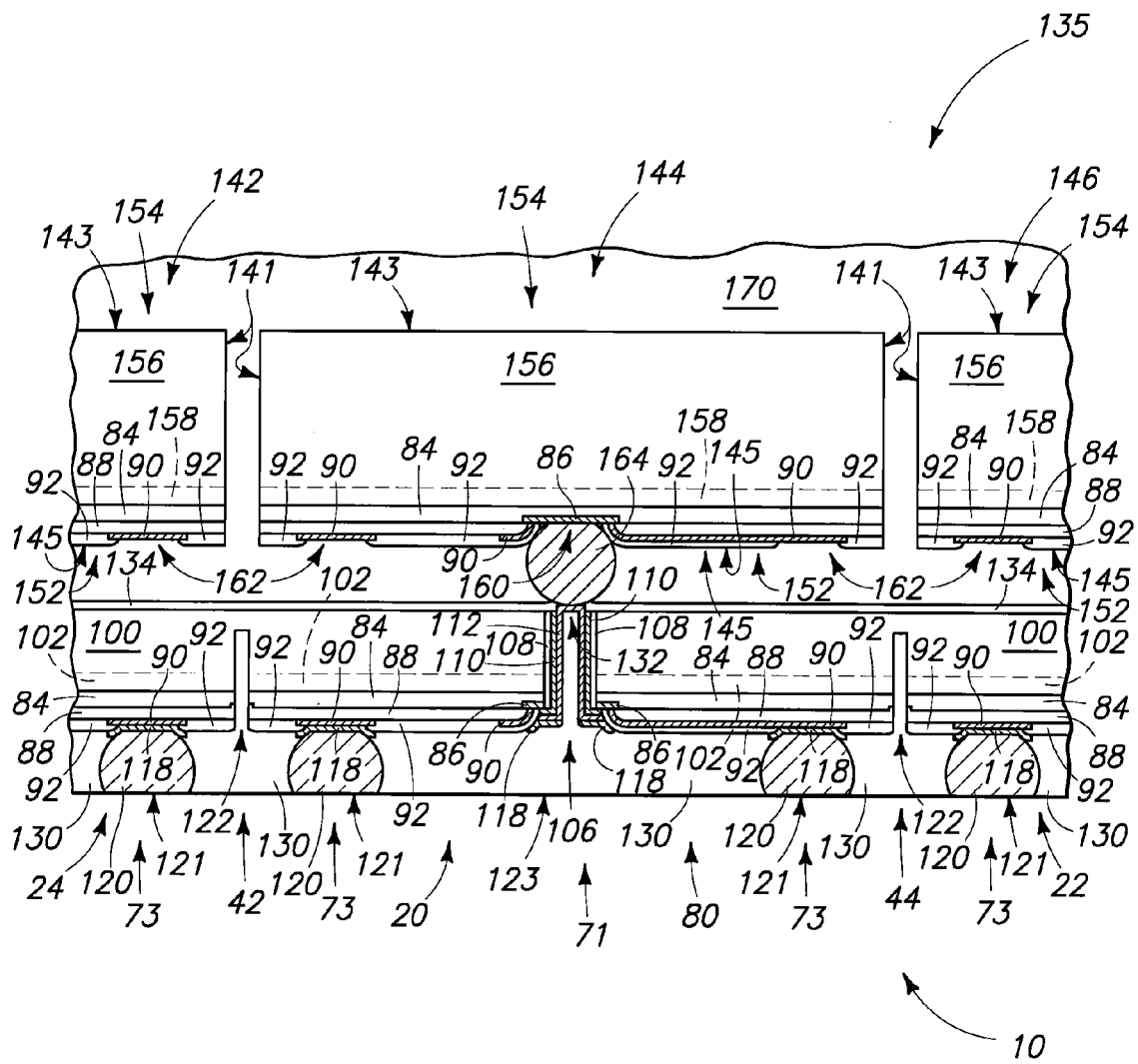
FIG. 15 is a view of the assembly of FIG. 13 shown at a processing stage subsequent to that of FIG. 13.

Referring next to FIG. 15, insulative material 170 is flowed to fill spaces between the back sides of the primary die regions and the front sides of the secondary dies, as well is to fill spaces between the secondary dies. The insulative material 170 can be a thermally-curable material identical to the material 130 (discussed above) in some aspects; or can be different from the material 130 in other aspects.

The secondary die can be considered to have sidewall surfaces 141, back side surfaces 143 and front side surfaces 145; and the insulative material is shown to be flowed (or in some aspects deposited) along all of such surfaces.

Referring next to FIG. 16, assembly 135 is shown inverted relative to the view of FIG. 15. Insulative material 170 has been planarized across the back side surfaces 143 of the secondary dies to form a planarized surface 171. Also, solder balls 172 have been bonded to the substantially planarized conductive nodes 121. Such bonding can be accomplished by, for example, placing tacky flux on the substantially planarized conductive node surfaces, placing solder balls 172 on the tacky flux, and then thermally treating the solder balls 172 and the substantially planarized solder surfaces 121 to bond the solder balls 172 to the surfaces 121. The solders balls can also be provided with a process utilizing thermal compression, solder tack, and then reflow.

Solder balls 172 can be utilized for electrically connecting packages (in other words, assemblies) formed in accordance with aspects of the present invention to circuitry external of the packages. In some aspects, balls 172 can be omitted, and surfaces 121 can be directly utilized for the electrical connection to the circuitry external of the packages.

Referring next to FIG. 17, construction 10 is singulated by cutting along the streets to form a semiconductor assembly or package comprising the primary die 20 paired with the secondary die 144 (note, the primary die region 20 of the wafer has become a primary die 20 through singulation of the die from the wafer). Since the trenches 122 (FIG. 16) did not extend entirely through the base semiconductor material 100 of the primary die, the singulated assembly comprises sections 190 along sidewall edges of primary die 100 that are not covered by either insulative material 135 or insulative material 170, and which are thus exposed. Additional insulative material can be deposited to encapsulate such exposed sidewall edges if desired.

In the aspects of the invention shown in FIGS. 1-17, singulated secondary dies are stacked over primary dies that are not yet singulated (in other words, that are still part of a wafer). It is to be understood, however, that the invention can also include aspects in which the primary dies are singulated prior to forming the stacked assemblies of the primary and secondary dies; and can include aspects in which a secondary wafer is provided over a primary wafer to form an assembly from which primary die/secondary die packages are subsequently singulated.

In some aspects, the construction of FIG. 17 can be considered to contain a primary semiconductor die 20 having a front side with circuitry 102 associated therewith, having a back side in opposing relation to the front side, having an outer periphery, and having at least one via 106 therein extending from the front side to the back side. The construction can further be considered to contain an electrically insulative material within the via and also around at least a portion of the outer periphery (in aspects in which materials 130 and 170 are the same composition as one another). The construction of FIG. 17 can be further considered to comprise circuitry outward of the back side of the primary die (the circuitry associated with regions 158 of the secondary die), and a conductive liner 112 within the via and electrically interconnecting the circuitry outward of the back side of the primary die with at least some of the circuitry associated with the front side of the secondary die.

In some aspects, the construction of FIG. 17 can be considered to contain a primary semiconductor die 20 having a front side with circuitry 102 associated therewith, having a back side in opposing relation to the front side, and having one or more vias 106 therein and extending from the front side to the back side. The construction further contains one or more conductive liners 112 within the one or more vias along the peripheries; insulative material 130 over the one or more conductive liners and within the one or more vias; and one or more electrical connections which extend from outward of the die back side, through at least one of the conductive liners, and to at least some of the circuitry associated with the front side.

The method of FIGS. 1-17 can, in some aspects, be considered to comprise providing a primary semiconductor die 20 having a front side with circuitry associated therewith, having a back side in opposing relation to the front side, and having an outer periphery. The method can be considered to further comprise forming at least one via 106 extending through the die from the front side to the back side. Additionally, the method can be considered to comprise forming an electrically insulative material 130/170 within the via and also around at least a portion of the outer periphery. In the shown aspect, the electrically insulative material 130 completely fills the via, or, in other words, blocks the via. The conductive liner 112 is shown formed within the via prior to forming the electrically insulative material within the via. The conductive liner can be considered to narrow the via, and the electrically insulative material can be considered to fill the narrowed via.

Figure 18:
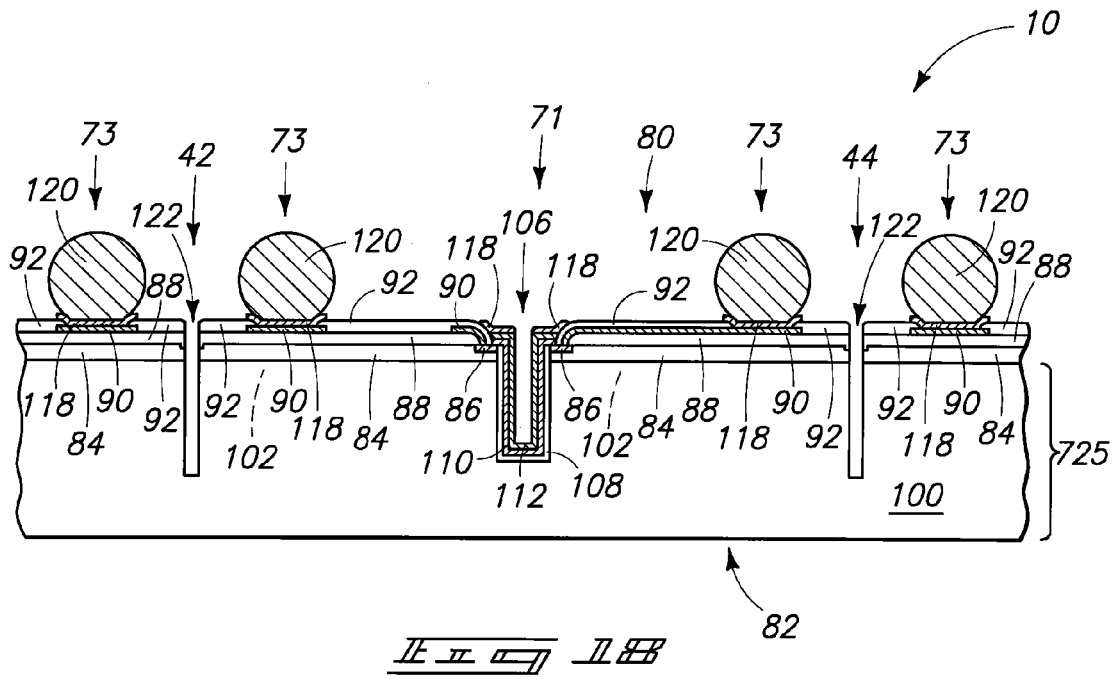
FIG. 18 is a view of the fragment of FIG. 2 shown at a processing stage subsequent to that of FIG. 6 in accordance with an aspect of the invention alternative to that of FIG. 7.
Figure 19:
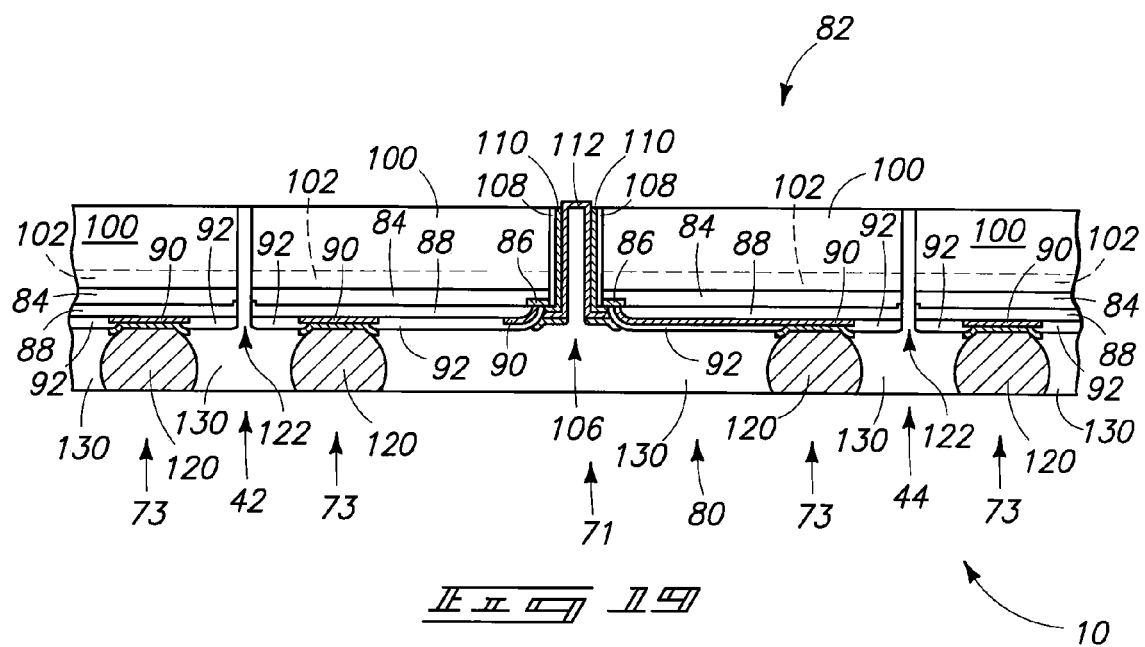
FIG. 19 is a view of the fragment of FIG. 18 shown at a processing stage analogous to that of FIG. 11, and shown inverted relative to the view of FIG. 18.
Figure 20:
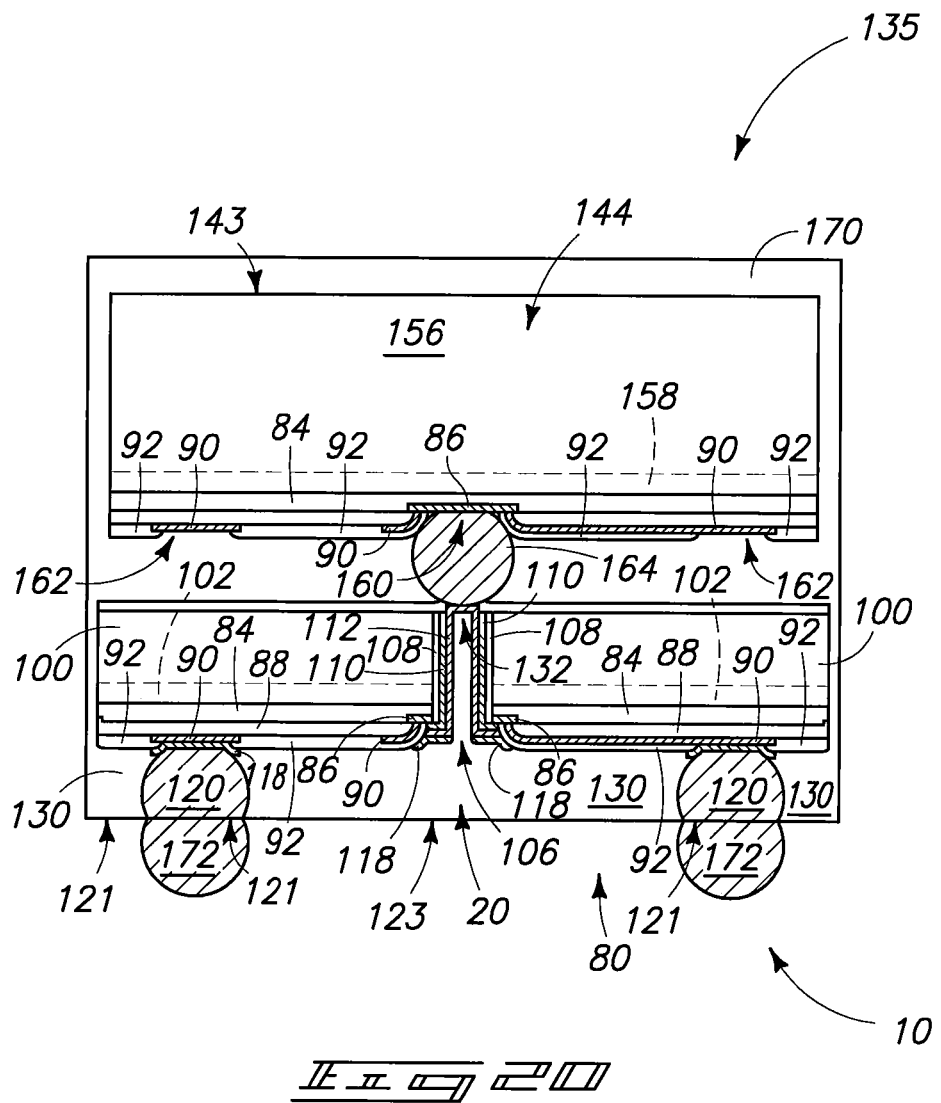
FIG. 20 is a view of an assembly comprising the fragment of FIG. 18, and formed in accordance with processing analogous to that of FIGS. 1-17.

FIGS. 18-20 illustrate an aspect of the invention in which trenches 122 are formed to extend deeper than via 106, and in which the exposed sidewall edges 190 of FIG. 17 are thus eliminated.

FIG. 18 shows construction 10 at a processing stage analogous to that of FIG. 7, but shows trenches 122 extending deeper than via 106.

FIG. 19 shows construction 10 at a processing stage subsequent to that of FIG. 18, and analogous to that discussed above with reference to FIG. 11. However, in contrast to FIG. 11, the trenches 122 extend entirely through base material 100 at the processing stage of FIG. 19 due to such trenches having been initially formed to be deeper than via 106.

FIG. 20 shows a singulated assembly analogous to that of FIG. 17, but formed utilizing the construction of FIG. 19. Since the trenches 122 extended entirely through base material 100, the insulative material 130 completely covers the sidewall edges of base semiconductor material 100 of the primary die of FIG. 20. In some aspects, the assembly of FIG. 20 can be considered to be a "6x" assembly in that all six surfaces of the rectangular-shaped dies are completely encapsulated with insulative materials 130 and 170.

In some applications of the aspect of the invention of FIGS. 18-20, the dicing of the first wafer to singulate the primary dies can be entirely completed before the encapsulation of the secondary dies.

The methodologies discussed above formed semiconductor packages having a pair of dies. It is to be understood that methodology of the present invention can also be utilized to form packages having more than two dies. Such can be accomplished by stacking of multiple dies having through wafer interconnects. The dies can be stacked after at least some have been singulated from semiconductor wafers; or prior to any singulation of the dies.

Figure 21:
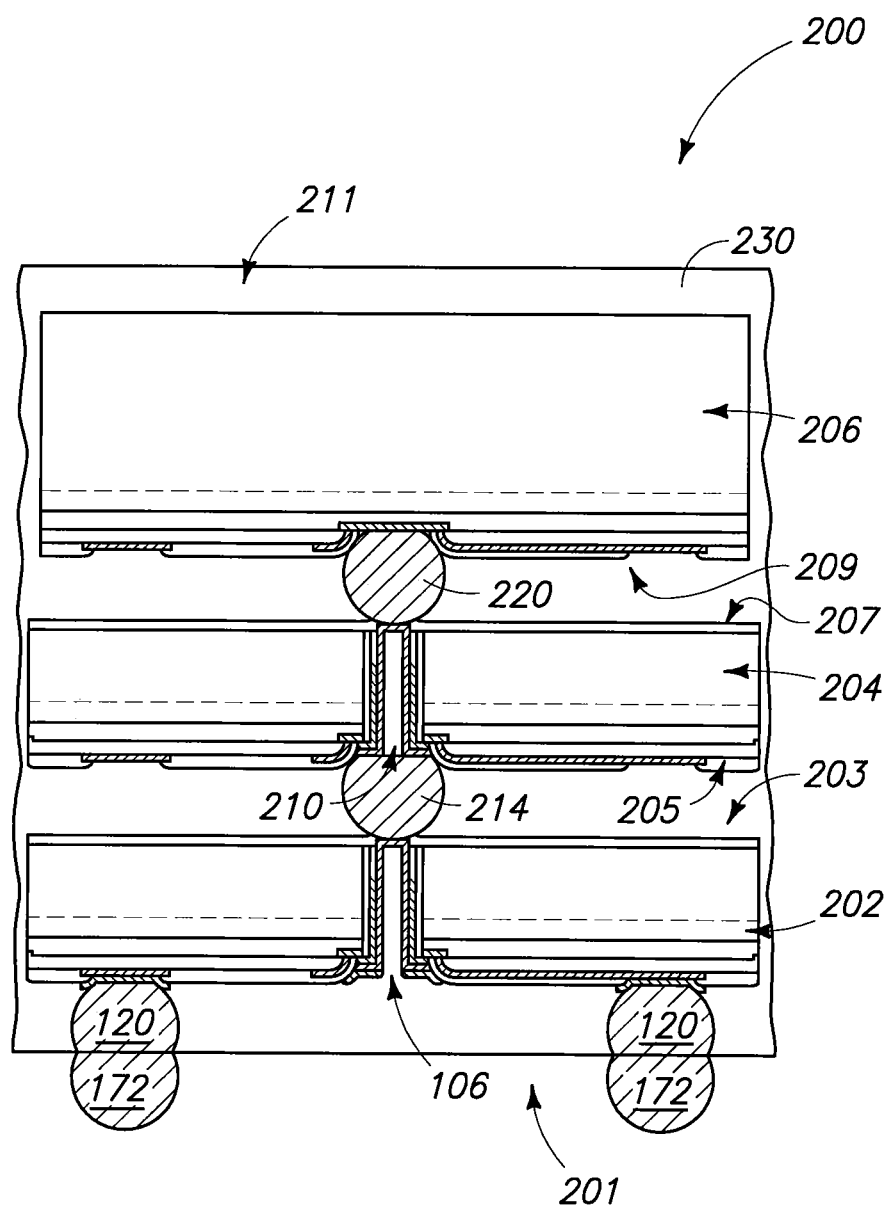
FIG. 21 is a view of an assembly comprising multiple semiconductor dies, and illustrating another aspect of the present invention.

FIG. 21 shows an assembly 200 comprising three semiconductor dies 202, 204 and 206. The dies 202, 204 and 206 can be considered to be a primary die, secondary die and tertiary die, respectively.

The primary die 202 is analogous to the primary dies discussed above and comprises a front side 201, and back side 203. Integrated circuitry (not shown) will typically be proximate the front side. Planarized solder balls 120 are shown at outer lead bond locations of the primary die, and solder balls 172 are shown bonded to the solder balls 120. The primary die 202 has a via 106 extending therethrough, and a conductive liner within the via.

The secondary die 204 comprises a front side 205 and back side 207. Integrated circuitry (not shown) will typically be proximate the front side. A via 210, analogous to the via 106, extends through the secondary die, and such is lined with a conductive liner. The via 210 can be referred as a second via to distinguish it from the first via 106 within the primary die, and the liner within the second via can be referred to as a second liner to distinguish it from the first liner within the first via.

A solder ball 214 electrically connects the second liner with the first liner, and thus electrically couples circuitry associated with secondary die 204 to circuitry associated with primary die 202.

The tertiary die 206 comprises a front side 209 and a back side 211. The front side has an inner lead bond pad location which is electrically connected through a solder ball 220 to the second conductive liner. Thus, circuitry associated with the tertiary die 206 is electrically coupled to circuitry associated with the secondary die 204 through the second conductive liner.

Insulative material 230 encapsulates the assembly 200, and extends around the primary die 202, secondary die 204 and tertiary die 206. The material 230 also fills the lined vias 106 and 210. Material 230 can be identical to the material 130 discussed above.

Although not shown, it is to be understood that the secondary and tertiary die can have under bump conductive material similar to the material 118 associated with the primary die.

FIG. 22 shows another assembly, 300, comprising three semiconductor dies 302, 304 and 306. The dies 302, 304 and 306 can be considered to be a primary die, secondary die and tertiary die, respectively.

The primary die 302 is analogous to the primary dies discussed above and comprises a front side 301, and back side 303. Integrated circuitry (not shown) will typically be proximate the front side. Planarized solder balls 120 are shown at outer lead bond locations of the primary die, and solder balls 172 are shown bonded to the solder balls 120. The primary die 302 has a via 106 extending therethrough, and a conductive liner within the via. In the shown aspect, the conductive liner is electrically connected with an interconnect 311 extending along the backside of die 302.

The secondary die 304 comprises a front side 305 and back side 307. Integrated circuitry (not shown) will typically be proximate the front side. A via 310, analogous to the via 106, extends through the secondary die, and such is lined with a conductive liner. The via 310 can be referred as a second via to distinguish it from the first via 106 within the primary die, and the liner within the second via can be referred to as a second liner to distinguish it from the first liner within the first via. The conductive liner within via 310 is electrically connected with a conductive interconnect 315.

A solder ball 314 electrically connects the second liner with the first liner, and thus electrically couples circuitry associated with secondary die 304 to circuitry associated with primary die 302. The solder ball 314 is laterally offset form the vias 106 and 310, and is electrically connected to interconnects 311 and 315.

The tertiary die 306 comprises a front side 309 and a back side 317. Integrated circuitry (not shown) will typically be proximate the front side. A via 350, analogous to the via 106, extends through the tertiary die, and such is lined with a conductive liner. The via 350 can be referred as a third via, and the liner within the third via can be referred to as a third liner. The conductive liner within via 350 is electrically connected with a conductive interconnect 351 extending along a front side of the tertiary die 306, and is electrically connected with an interconnect 353 extending along the backside of tertiary die 306.

The circuitry associated with the tertiary die 306 is electrically coupled to circuitry associated with the secondary die 304 through a solder ball 320, which is shown to be laterally offset from vias 310 and 350.

Although not shown, it is to be understood that the secondary and tertiary die can have under bump conductive material similar to the material 118 associated with the primary die.

Encapsulant (not shown) can be provided around assembly 300 using any suitable processing, including, for example, the vacuum burp process discussed above.

Although the aspects shown and described above have the vias provided in lead bonds that are centrally located on a die relative to other lead bond pads, it is to be understood that the vias can additionally, or alternatively, be provided in lead bonds that are peripherally located. In some aspects, such can correspond to applications in which bond pads analogous to "inner lead bond pads" are actually peripherally outward of bond pads analogous to "outer lead bond pads".

Semiconductor assemblies formed in accordance with aspects of the present invention can be utilized in numerous applications. For instance, the assemblies can be incorporated into various electronic systems, such as, for example, computer systems, phones, cars, airplanes, camcorders, cameras, medical devices, etc. The assemblies can provide various circuit functions within such systems, including memory and/or processing functions. FIGS. 23-27 illustrate exemplary electronic systems comprising semiconductor packages 500 formed in accordance with various aspects of the present invention (for instance, the packages can correspond to any of the assemblies of FIGS. 17 and 20-22). The packages are configured to interact with circuitry present in the electronic systems, and to perform desired functions relative to such circuitry, such as, for example, memory and/or processing.

Referring to FIG. 23, a computer system 524 includes one or more of the packages 500, which can be mounted to the computer system 524 in a suitable manner. The packages 500 can be configured to perform a desired function in the computer system 524 such as memory (specifically, short term memory, such as random access memory), storage (specifically, long term memory) or micro processing.

Referring to FIG. 24, a digital camcorder system 526 includes one or more packages 500, which can be mounted in a suitable manner, and configured to perform one or more desired circuit functions in the camcorder system 526.

Referring to FIG. 25, a camera system 528 includes one or more packages 500, which can be mounted in a suitable manner, and configured to perform one or more desired circuit functions in the camera system 528.

Referring to FIG. 26, a cellular phone system 530 includes one or more packages 500, which can be mounted in a suitable manner, and configured to perform one or more desired circuit functions in the cellular phone system 530.

Referring to FIG. 27, a medical device system 532 includes one or more packages 500, which can be mounted in a suitable manner, and configured to perform one or more desired circuit functions in the medical device system 532.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a construction, comprising:
providing a semiconductor die having a front side with circuitry associated therewith, having a back side in opposing relation to the front side, having an electrically conductive material pad, and having an outer periphery;
forming at least one via extending through the die from the front side toward the back side and at least partially through a base semiconductor material of the die;
forming a liner of insulative material lining the via where the insulative material does not extend over the electrically conductive material pad;
forming an electrically insulative material within the via and also around at least a portion of the outer periphery; and
forming a conductive liner within the via over the liner of insulative material and extending over the electrically conductive material pad prior to forming the electrically insulative material within the via, the conductive liner narrowing the via and the electrically insulative material filling the narrowed via.

2. The method of claim 1 wherein the semiconductor die is a first semiconductor die, and further comprising:
removing material from the back side of the first semiconductor die to expose the conductive liner;
providing a second semiconductor die stacked face to back side of the first die having a second front side with circuitry associated therewith; and
electrically interconnecting said at least some of the circuitry associated with the front side of the first die with circuitry associated with the second front side through the conductive liner via a solder ball that contacts the conductive liner.

3. A method of forming a semiconductor assembly, comprising:
providing a first wafer comprising a plurality of first semiconductor dies having pads of electrically conductive material; the first dies having first front sides, and first back sides in opposing relation to the first front sides;
forming vias extending through the first front sides and into the first dies;

forming liners of insulative material lining the vias, where the insulative material does not extend over the electrically conductive material of the pads;

forming conductive liners within the vias over the liners of insulative material and extending over the electrically conductive material of the pads;

filling the lined vias with electrically insulative material;

exposing segments of the conductive liners along a backside of the conductive liners;

providing second semiconductor dies having second front sides stacked face to first back side of the first dies having first front sides;

providing electrical interconnects extending from the second front sides to the exposed segments of the conductive liners utilizing solder balls; and singulating the first semiconductor dies from the first wafer.

4. The method of claim 3 wherein the second semiconductor dies are provided as singulated dies.

5. The method of claim 3 wherein the second semiconductor dies are together provided as a second wafer; and wherein the singulating singulates the second semiconductor dies from the second wafer.

6. The method of claim 3 wherein the singulating of the first semiconductor dies occurs after the providing of the electrical interconnects.

7. The method of claim 3 wherein the singulating of the first semiconductor dies occurs before the providing of the electrical interconnects.

8. The method of claim 3 further comprising encapsulating outer surfaces of the first and second dies prior to the singulating of the first semiconductor dies.

9. The method of claim 3 wherein the exposing of the segment of the conductive liners comprises thinning of the first back sides of the first dies.

10. The method of claim 3 wherein the forming the electrically insulative material comprising flowing encapsulant material within the vias and then thermally curing the encapsulant material.

11. The method of claim 10 further comprising, prior to the thermal curing, performing at least one sequence of exposure of the encapsulant material to changing pressure to assist the flow of the encapsulant material into the vias.

12. The method of claim 3 wherein the electrical interconnects are solder balls.

13. The method of claim 3 wherein the first dies comprise outer lead bond pads along the first front sides, inner lead bond pads along the first front sides, and conductive redistribution layers extending from the inner lead bond pads to the outer lead bond pads;

wherein the vias extend through the inner lead bond pads, and the conductive liners are formed to be electrically coupled with the inner lead bond pads; and further comprising bonding solder balls to the outer lead bond pads.

14. The method of claim 13 wherein the solder balls are first solder balls; and wherein the electrically insulative material is formed over the first front sides during the filling of the vias, and further comprising:

grinding the electrically insulative material and first solder balls to form substantially planarized surfaces extending across the electrically insulative material and the first solder balls; and connecting second solder balls to the substantially planarized surfaces of the first solder balls.

15. The method of claim 14 wherein the grinding of the electrically insulative material and the first solder balls to form the substantially planarized surfaces occurs before the providing of the electrical interconnects extending from the second front sides to the exposed segments of the conductive liners.

16. The method of claim 15 wherein the connecting of the second solder balls occurs after the providing of the electrical interconnects extending from the second front sides to the exposed segments of the conductive liners.

17. A method of forming a semiconductor assembly, comprising:

providing a semiconductor wafer having a primary die region; the wafer having a first front side, and having a first back side in opposing relation to the first front side;

forming a via within the primary die region and extending through the first front side, through an electrically conductive material pad and into a first die;

forming a liner of insulative material lining the via, where the insulative material does not extend over the electrically conductive material of the pad;

forming a conductive liner within the via over the liner of insulative material and extending over the electrically conductive material of the pad;

connecting solder balls to the first front side;

forming a dammed region of relatively high viscosity material around a periphery of the first front side, and flowing relatively low viscosity material within the dammed region to cover the first front side between the solder balls and fill the via;

curing the relatively low viscosity material into a substantially solid electrically insulative material within the via and over the first front side;

grinding the solder balls and substantially solid electrically insulative material to form a substantially planarized surface over the first front side;

thinning the back side of the wafer to expose a segment of the conductive liner;

providing a secondary semiconductor die having a second front side stacked front to first back side with the first die; and providing an electrical interconnect extending from the second front side to the exposed segment of the conductive liner utilizing a solder ball.

18. The method of claim 17 wherein the flowing of the relatively low viscosity material is conducted at a first temperature and the curing of the relatively low viscosity material comprises changing the temperature to a second temperature.

19. The method of claim 18 further comprising, after the flowing of the relatively low viscosity material and prior to the curing of the relatively low viscosity material, performing at least one sequence of exposure of the relatively low viscosity material to changing pressure to assist the flow of the relatively low viscosity material into the via.

20. The method of claim 17 wherein the solder balls are first solder balls, and wherein the electrical interconnect comprises a second solder ball.

21. The method of claim 17 wherein the thinning occurs after the grinding.

22. A method of forming a plurality of semiconductor assemblies, comprising:

providing a semiconductor wafer comprising a plurality of primary die regions containing primary dies; the semiconductor wafer having a front side extending across the primary die regions, and having a back side extending across the primary die regions in opposing relation to the front side;

forming vias within individual primary die regions, the vias extending through the front side, through electrically conductive material pads and into the semiconductor wafer;

forming liners of insulative material lining the vias, where the insulative material does not extend over the electrically conductive material of the pads;

forming conductive liners within the vias over the liners of insulative material and extending over the electrically conductive material of the pads;

filling the lined vias with electrically insulative material;

thinning a backside of the semiconductor wafer to expose segments along back sides of the conductive liners;

providing a plurality of secondary dies having front sides stacked front side to back side of the primary dies;

providing electrical interconnects comprising solder balls extending from front sides of individual secondary dies to segments of conductive liners associated with individual primary die regions; and after forming the electrical interconnects, singulating the primary dies from the semiconductor wafer to form semiconductor assemblies which individually comprise one of the secondary dies paired with one of the primary dies.

23. The method of claim 22 wherein the semiconductor wafer has streets between the primary die regions, and further comprising:

forming trenches extending into the front side of the semiconductor wafer along the streets; and filling the trenches with the electrically insulative material simultaneously with the filling of the lined vias with the electrically insulative material.

24. The method of claim 23 wherein the trenches extend to a depth within the semiconductor wafer at least as deep as the vias; and wherein the thinning exposes the electrically insulative material within the trenches.

25. The method of claim 23 wherein the trenches extend to a depth within the semiconductor wafer that is less deep than the vias; and wherein the thinning does not expose the electrically insulative material within the trenches.

26. The method of claim 22 wherein the primary die regions have inner regions comprising inner lead bond pads, have outer regions comprising outer lead bond pads, and have redistribution layers extending from the inner lead bond pads to the outer lead bond pads; and wherein the vias are formed to extend through the inner lead bond pads.

27. The method of claim 26 further comprising bonding solder balls to the outer lead bond pads prior to the filling of the lined vias with the electrically insulative material; and providing the electrically insulative material to extend across the front side of the semiconductor wafer between the solder balls during the filling of the lined vias with the electrically insulative material.

28. The method of claim 27 further comprising grinding the electrically insulative material and solder balls to form a substantially planarized surface extending across the electrically insulative material and the solder balls.

29. The method of claim 28 wherein the solder balls are first solder balls; and wherein the electrical interconnects are second solder balls extending from the second front sides to the exposed segments of the conductive liners.

30. The method of claim 29 wherein the grinding of the electrically insulative material and solder balls to form the substantially planarized surface occurs before the providing of the second solder balls extending from the second front sides to the exposed segments of the conductive liners.

31. The method of claim 22 further comprising providing the electrically insulative material between the primary die regions and secondary dies after the providing of the electrical interconnects and prior to the singulating.

32. The method of claim 22 further comprising providing a plurality of tertiary dies having front sides, and providing electrical interconnects from front sides of individual tertiary dies to the front sides of individual secondary dies; and wherein the singulating the primary die regions forms the semiconductor assemblies to individually comprise one of the tertiary dies together with the one of the secondary dies and the one of the primary dies.

33. The method of claim 32 wherein the vias formed in the primary die regions are first vias; wherein the secondary dies have back sides in opposing relation to the front sides; further comprising forming conductively-lined second vias extending from the front sides of the individual secondary dies to the back sides; wherein the tertiary dies are along the back sides of the secondary dies; and wherein the forming of the electrical interconnects from the front sides of the individual tertiary dies to the front sides of the individual secondary dies comprises electrically connecting circuitry associated with the front sides of the individual tertiary dies to the conductive linings of the conductively-lined second vias.

34. The method of claim 33 wherein the electrical connection of the circuitry associated with the front sides of the individual tertiary dies to the conductive linings of the conductively-lined second vias comprises one or more solder balls extending between the front sides of the individual tertiary dies and the back sides of the secondary dies.

* * * * *